(12) United States Patent
Tanigaki et al.

(10) Patent No.: US 8,785,851 B2
(45) Date of Patent: Jul. 22, 2014

(54) INTERFERENCE ELECTRON MICROSCOPE

(71) Applicant: Riken, Wako (JP)

(72) Inventors: Toshiaki Tanigaki, Wako (JP); Shinji Aizawa, Wako (JP); Tsuyoshi Matsuda, Wako (JP); Ken Harada, Tokyo (JP); Yoshio Takahashi, Tokyo (JP)

(73) Assignees: Hitachi, Ltd., Tokyo (JP); Riken, Saitama (JP)

( * ) Notice: Subject to any disclaimer, the term of this patent is extended or adjusted under 35 U.S.C. 154(b) by 0 days.

(21) Appl. No.: 13/900,589

(22) Filed: May 23, 2013

(65) Prior Publication Data

US 2013/0313432 A1 Nov. 28, 2013

(30) Foreign Application Priority Data

May 24, 2012 (JP) .................................. 2012-118162

(51) Int. Cl.
*H01J 37/26* (2006.01)
*H01J 37/04* (2006.01)
*G01B 15/00* (2006.01)

(52) U.S. Cl.
USPC ........................... 250/311; 250/306; 250/310

(58) Field of Classification Search
USPC .......................................... 250/306, 310, 311
See application file for complete search history.

(56) References Cited

U.S. PATENT DOCUMENTS

| | | | | |
|---|---|---|---|---|
| 4,935,625 A * | 6/1990 | Hasegawa et al. | ............... | 850/9 |
| 5,192,867 A * | 3/1993 | Osakabe et al. | ............... | 250/311 |
| 5,811,806 A * | 9/1998 | Honda et al. | ................... | 250/311 |
| 7,417,227 B2 * | 8/2008 | Matsumoto et al. | ........... | 250/311 |
| 7,518,111 B1 * | 4/2009 | Matsumoto et al. | ........... | 250/311 |
| 7,923,685 B2 * | 4/2011 | Harada et al. | ................. | 250/310 |
| 8,193,494 B2 * | 6/2012 | Harada et al. | ................. | 250/311 |
| 2003/0122075 A1 * | 7/2003 | Voelkl | ............ | 250/311 |
| 2003/0160969 A1 * | 8/2003 | Endo et al. | .................... | 356/520 |
| 2008/0067375 A1 * | 3/2008 | Kasai et al. | ................... | 250/310 |
| 2011/0031395 A1 * | 2/2011 | Harada et al. | ................. | 250/307 |
| 2012/0241612 A1 * | 9/2012 | Harada et al. | ................. | 250/311 |
| 2013/0284925 A1 * | 10/2013 | Tanigaki et al. | ............. | 250/311 |

FOREIGN PATENT DOCUMENTS

| | | |
|---|---|---|
| JP | 2006-164861 | 6/2006 |
| JP | 2006-216345 | 8/2006 |
| JP | 2006-313069 | 11/2006 |
| JP | 2011-40217 | 2/2011 |
| JP | 2011-249191 | 12/2011 |
| WO | WO 2010/026867 A1 | 3/2010 |

OTHER PUBLICATIONS

Akira Tonomura et al., Applications of electron holography, Reviews of Modern Physics, Jul. 1987, vol. 59, No. 3, Part 1.

* cited by examiner

*Primary Examiner* — Michael Logie
(74) *Attorney, Agent, or Firm* — Antonelli, Terry, Stout & Kraus, LLP.

(57) ABSTRACT

In an interference electron microscope, a first electron biprism is disposed between an acceleration tube and an illumination-lens system, a mask is disposed between the acceleration tube and the first electron biprism, and the first electron biprism is arranged in a shadow that the mask forms. Current densities of first and second electron beams on a parabolic surface of an objective lens system where a sample is positioned are controlled by a control system by an optical action of the illumination-lens system, the mask is imaged on the parabolic surface of the objective lens system, and an electro-optical length between the first electron biprism and the parabolic surface of the objective lens where the sample is positioned is controlled without generating Fresnel fringes on a sample surface from the mask and the first electron biprism.

31 Claims, 15 Drawing Sheets

INTERFERENCE ELECTRON MICROSCOPE

CLAIM OF PRIORITY

The present application claims priority from Japanese patent application JP2012-118162 filed on May 24, 2012, the content of which is hereby incorporated by reference into this application.

BACKGROUND OF THE INVENTION

1. Field of the Invention

The present invention relates to a device for utilizing electron beams, and more particularly relates to electron interference technologies used in interference electron microscopes and others.

2. Description of the Related Art

An electron interference device pertains to a technique for quantitatively measuring an electromagnetic field in a substance or in a vacuum by measuring a change in phase of an electron beam. FIG. 1A, illustrates an interference optical system in an existing electron holography. An electron beam 2 which has been emitted from an electron source 1 goes forward as illustrated in the drawing. A current density of the electron beam is adjusted by a first illumination electron lens 3 and a second illumination electron lens 4, a sample 6 is disposed on one side of an optical axis between the second illumination electron lens 4 and an objective lens 5, and the sample 6 which is placed on a parabolic surface 42 of the objective lens 5 is irradiated with the electron beam. An image obtained by an action of the objective lens 5 is magnified by a magnifying lens 9, an electron beam 7 which has passed through a first region (the sample) on the parabolic surface 42 and an electron beam 8 which has passed through a second area on the parabolic surface 42 are bent inward by a second electron biprism 10 and are superposed on an observation surface 11 and interfere with each other, and thereby interference fringes are detected. A phase is recovered from the obtained interference fringes and the change in phase of the electron beam caused by the presence of the sample 6 is obtained.

An electron biprism has a function of deflecting electron beams passing along the right and left sides of a filament electrode which is disposed between parallel plates disposed in parallel with a traveling direction of the electron beam inward or outward relative to an optical axis with an electric field which is generated between the filament electrode and the parallel plates by applying a potential to the filament electrode. In general, a system having a mechanism which rotates relative to the optical axis and a system having a mechanism for moving an electron biprism within a plane vertical to the optical axis are commercially available. Incidentally, in this specification, although when the electron biprism strictly indicates a filament electrode in an optical system, it will be expressed as the "filament electrode of the electron biprism" or the "filament electrode", and when it is used customarily as an electron beam deflector, it will be expressed simply as the "electron biprism", with respect to numerals to be assigned to respective elements, numerals which are the same as the above will be used.

In the above-mentioned method, the electron beam 7 passing through the first region and the electron beam 8 passing through the second region are adjacent to each other at the position of the sample 6. A width of an interference region which is measured in conversion of the sample surface is limited by a coherence length in a sample in-plane direction of the electron beam which has been radiated to the sample surface (see Tonomura A., (1987) Applications of electron holography, Rev. Mod. Phys. 59: pp. 639-669). In addition, Japanese Patent Application Laid-Open No. 2006-216345, Japanese Patent Application Laid-Open No. 2006-164861, Japanese Patent Application Laid-Open No. 2006-313069, Japanese Patent Application Laid-Open No. 2011-249191, WO2010/026867 and Japanese Patent Application Laid-Open No. 2011-040217 are proposed as patent documents relating to such devices as mentioned above.

SUMMARY OF THE INVENTION

The coherence length in the above-mentioned electron interference device will be described using FIG. 2 in order to explain the subject of the present invention. In a configuration as illustrated in FIG. 2, an electron source 101, a size 102 of the electron source, a length (a distance) 103 between the electron source 101 and a sample surface 104 and the sample surface 104 have a relationship which meets the following expression (1) where $\beta$ is an angle of aperture, $\lambda$ is a wavelength of the electron beam and $L_C$ is a coherence length:

[Numerical Formula 1]

$$Lc = \lambda/2\beta \qquad (1)$$

In addition, a width $W_{max}$ of the largest possible interference region obtained and the coherence length $L_C$ have a relationship which meets the following expression (2):

[Numerical Formula 2]

$$W_{max} < L_C \qquad (2)$$

In an actual electron device, contracted or magnified images of the electron source are electro-optically identical with each other by actions of the electron source and an illumination-lens system, an objective lens system or an imaging lens system. In addition, a parabolic surface is identical with an image surface where the sample 6 is magnified or contracted at a position different from the sample position on an optical axis of the electron beam by the action of a lens of the illumination-lens system, the objective lens system or the imaging lens system.

Since the coherence length of the radiated electron beam on the sample surface is limited, the contrast of interference fringes is lost as the width of the interference region is increased in order to observe the inside of a thin film sample and it is difficult to make the interference width larger than the coherence length. Thus, high-contrast interference fringes are observed only in a narrow interference region in the existing electron holography.

In addition, since electrostatic charge which is generated by radiating a converged electron beam to the sample adversely affects the electron beam 8 passing through the second region to distort the interference fringes, such a disadvantage occurs that it becomes difficult to obtain a high-precision phase-recovered image. Further, a sample which is large in magneto-static leakage field also has the above-mentioned disadvantage. That is, the magneto-static leakage field adversely affects the electron beam 8 passing through the second region to distort the interference fringes and therefore high-precision phase analysis is obstructed. In order to eliminate the above-mentioned disadvantage, it is desirable to increase an in-place length between the electron beam 7 which is transmitted through the first region (the sample) and the electron beam 8 which passes through the second region on the sample surface.

A method of splitting an electron beam by an electron biprism disposed in an illumination-lens system and radiating the split electron beams to different regions of a sample surface with no provision of an objective lens to be used for imaging a sample image is proposed as a scanning interference electron microscopy in Japanese Patent Application Laid-Open No. 2006-164861. This technique is a method of radiating a converged electron probe to a vacuum region and the sample on the sample surface, detecting interference fringes of an electron beam passing through the vacuum region and an electron beam transmitted through the sample by a detector disposed on a lower side and scanning the probe or the sample while acquiring phase information to acquire information on an electromagnetic field in the sample surface. This technique is advantageous in that data is readily acquired when once a condition is settled, the magnification is readily changed and a ratio of a signal of the phase information to noise is high. However, since the converged electron beam is radiated to the sample and therefore electromagnetic field information on all regions irradiated with the coned electron probe is acquired at a certain observation point during scanning, if the sample is thick, resolution will be increased by the amount corresponding to a larger diameter of the electron beam at a position on the upper or lower surface of the sample when the coned electron probe passes through the sample. For this reason, it may be said that application thereof to a technique which requires an image that two-dimensional projected phase information is not laterally blurred as in, for example, tomography is unsuitable.

On the other hand, the inventors of the present invention have proposed such a method illustrated in FIG. 2 that the sample is irradiated with an electron beam 7 which is transmitted through the sample placed in a first region and an electron beam 8 which passes through a second region on the sample surface while keeping a length between the electron beams 7 and 8 as illustrated in FIG. 1B in the above-mentioned Japanese Patent Application Laid-open No. 2011-249191. In this method, a first electron biprism 12 is installed in the illumination-lens system, the electron wave is split and its traveling direction is deflected by the first electron biprism 12, the sample is irradiated with the electron beam 7 transmitted through the first region (the sample) and the electron beam 8 passing through the second region on the sample surface while keeping the length between the electron beams 7 and 8, and the electron beams are deflected by the second electron biprism 10 which is provided downstream of the sample position in an electron beam traveling direction to make the electron beams interfere with each other on the observation surface 11, thereby detecting interference fringes. In the above-mentioned case, since the electron beam which is coherent in an in-plane direction is radiated in a split state as the electron beam 7 transmitted through the first region (the sample) and the electron beam 8 passing through the second region on the ample surface, it is possible in principle to obtain high-contrast interference fringes even when the length between the electron beam 7 transmitted through the first region (the sample) and the electron beam 8 passing through the second region on the sample surface is increased more than a coherence length in the in-plane direction of the radiated electron beam when the electron beam is not split by the first electron biprism 12.

However, in the actual electron beam device, it is required to optimize a device configuration of the illumination-lens system and a condition that currents of lenses in the illumination-lens system are used for obtaining coherency of the electron beam on the sample surface in order to obtain the effect of above mentioned split radiation. Specifically, there is such a disadvantage that when a region where interference of the electron beam occurs on an electro-optical sample surface is hidden behind the filament electrode of the first electron biprism 12, the interference fringes themselves are not obtained.

In addition, when the electro-optical position of the first electron biprism matches the electro-optical position of the sample, the electron beam will be radiated to a position on the sample surface which is the same as the position to which an electron beam which is not deflected is radiated by the lens action of the illumination-lens system even if a deflecting action works on the electron beam by the first electron biprism. In the above mentioned case, such a disadvantage occurs that a function of adjusting the length for split radiation of the electron beams on the sample surface is lost. Although the above-mentioned disadvantage is eliminated by adjusting the illumination optical system such that an electro-optical position of the first electron biprism does not match an electro-optical position of the sample, when doing so, such a disadvantage occurs that Fresnel fringes are generated from the first electron biprism on the sample surface to disturb a finally observed hologram.

The present invention has been made in order to eliminate the above-mentioned disadvantages and aims to provide an interference electron microscope that a length between an electron beam transmitted through a sample placed in a first region and an electron beam passing through a second region is increased by using an illumination-lens system biprism to obtain high-contract interference fringes.

According to an embodiment of the present invention, there is provided an interference electron microscope which includes an electron source, an acceleration tube for accelerating an electron beam emitted from the electron source to a predetermined speed, an illumination-lens system for radiating the electron beam to a sample and including at least one electron lens, a sample holding unit for holding the sample, an objective lens system for imaging an image of the sample and including at least one electron lens, an imaging lens system for imaging the image of the sample imaged by the objective lens system in a magnified or contracted state and including at least one electron lens, an observation surface used for observing the image of the sample imaged by the imaging lens system, an observation/recording system for observing or recording the image of the sample imaged on the observation surface, a first electron biprism disposed between the acceleration tube and the illumination-lens system and a mask disposed between the acceleration tube and the first electron biprism, wherein the objective lens system or the imaging lens system includes at least one electron biprism, the electron beam is split into a first electron beam and a second electron beam by the mask, current densities of the first electron beam and the second electron beam on a parabolic surface of the objective lens system where the sample is positioned are controlled by an optical action of the illumination-lens system, an electro-optical length between the first electron beam biprism and the parabolic surface of the objective lens system where the sample is positioned is controlled by the optical action of the illumination-lens system and the mask is imaged on the parabolic surface of the objective lens system and mutually different first region and second region on the parabolic surface of the objective lens system where the sample is positioned are irradiated by the optical action of the illumination-lens system, positions of the first region and second region are controlled by a deflecting action on the electron beams by the first electron beam biprism or the optical action on the first electron beam and the second electron beam by the illumination-lens system, the first electron beam and the second electron beam are superposed on the observation surface by the electron beam biprism included in the objective lens system or the imaging lens system and a superpose region on the observation surface where the first electron beam and the second electron beam are superposed is observed or recorded by the observation/recording system.

According to another embodiment of the present invention, there is provided an interference electron microscope which includes an electron source, an acceleration tube for accelerating an electron beam emitted from the electron source to a predetermined speed, an illumination-lens system for radiating the electron beam to a sample, a sample holding unit for holding the sample, an objective lens system for imaging an image of the sample and including at least one electron lens, an imaging lens system for imaging the image of the sample imaged by the objective lens system in a magnified or contracted state, an observation surface used for observing the image of the sample imaged by the imaging lens system, an observation/recording system for observing or recording the image of the sample imaged on the observation surface, a first electron biprism disposed between an electron lens positioned uppermost-stream of the illumination-lens system in an electron beam traveling direction and the sample and a mask disposed between the acceleration tube and the first electron biprism, wherein the objective lens system or the imaging lens system includes at least one electron biprism, the electron beam is split into a first electron beam and a second electron beam by the mask, current densities of the first electron beam and the second electron beam on a parabolic surface of the objective lens system where the sample is positioned are controlled by an optical action of the illumination-lens system, the mask is imaged on the parabolic surface of the objective lens system by the optical action of the illumination-lens system, an electro-optical length between the first electron beam biprism and the parabolic surface of the objective lens system where the sample is positioned is controlled and mutually different first region and second region on the parabolic surface of the objective lens where the sample is positioned are irradiated by the optical action of the illumination-lens system, positions of the first region and second region are controlled by a deflecting action on the electron beams by the first electron beam biprism or the optical action on the first electron beam and the second electron beam by the illumination-lens system, and the first electron beam and the second electron beam are superposed on the observation surface by the electron beam biprism included in the imaging lens system, and a superpose region on the observation surface where the first electron beam and the second electron beam are superposed is observed or recorded by the observation/recording system.

Further, according to preferred embodiments of the present invention, on an optical axis of the electron beam, a surface on which the first electron source is positioned or a surface on which the first electron source is imaged as a latent image or a real image by the action of the electron lens of the illumination-lens system, a surface on which the first electron biprism is positioned or a surface on which the first electron biprism is imaged as a latent image or a real image by the action of the electron lens of the illumination-lens system, and a surface on which the sample is positioned or a surface on which the sample is imaged as a latent image or a real image by the action of the electron lens of the illumination-lens system are in a positional relationship that they are continuously positioned with no electron lens interposed among them. Paying attention to the above-mentioned three surfaces which are in the above-mentioned positional relationship, there are respectively defined as an electro-optical electron source surface, an electro-optical first filament electrode surface and an electro-optical sample surface. The order in which the above-mentioned electro-optical electron source surface, electro-optical first filament electrode surface and electro-optical sample surface are arranged is not limited to be arranged in order of the electro-optical electron source surface, the electro-optical first filament electrode surface comes and the electro-optical sample surface in the electron beam traveling direction and is changed depending on the configuration of an illumination-lens system used and a using method adopted. A length L between the electro-optical electron source surface and the electro-optical sample surface and a length L2 between the electro-optical first filament electrode and the electro-optical sample surface are controlled, a length between the electro-optical electron source surface and the electro-optical first filament electrode surface is controlled, a length between the electro-optical electron source surface and an electro-optical mask surface is controlled, it is controlled such that the electro-optical mask surface matches the electro-optical sample surface, an angle of aperture $\beta_M$ of the electro-optical electron source surface relative to the electro-optical mask surface is controlled, and a coherence length of an electron wave on the electro-optical mask surface is controlled by the optical action of the illumination-lens system. As a result, there is also provided an interference electron microscope which eliminates the disadvantage that the mask hides the coherence region of the electron beam on the sample surface and also eliminates the disadvantage that the first filament electrode hides the coherence region of the electron beam when the above-mentioned elements are in a relationship meeting the following expression (3) or (4) where $\lambda$ is a wavelength of the electron beam, $\beta_M$ is the angle of aperture of the electro-optical electron source surface relative to the electro-optical mask surface, $L_M$ is a coherence length of the electron wave on the electro-optical mask surface, and $d_M$ is a width of the electro-optical mask:

[Numerical Formula 3]

$$\beta_M < \lambda/2d_M \quad (3)$$

[Numerical Formula 4]

$$L_M > d_M \quad (4)$$

In addition, according to a preferred embodiment of the present invention, there is also provided an interference electron microscope which eliminates the disadvantage that the function of adjusting the length for split radiation of the electron beams on the sample surface which is attained by the optical action of the first electron biprism is lost in the case where the electro-optical first biprism position matches the electro-optical sample position, when the respective elements are in a relationship meeting the following expression (5):

[Numerical Formula 5]

$$0 \neq L2 \quad (5)$$

According to the present invention, it is allowed to provide the interference electron microscope which obtains the high-contrast interference fringes.

DETAILED DESCRIPTION OF THE PREFERRED EMBODIMENTS

Before describing interference electron microscopes according to various embodiments of the present invention with reference to the accompanying drawings, a principle configuration of an interference electron microscope utilizing a transmission electron microscope according to the present invention will be described using a schematic diagram in FIG. 3. Incidentally, although FIG. 3 illustrates an example of one configuration of the interference electron microscope according to the first embodiment utilizing the transmission electron microscope as described later, the principle configuration which will be described hereinafter is also applicable to interference electron microscopes of configurations of other embodiments which will be described using other drawings.

Figure 3:
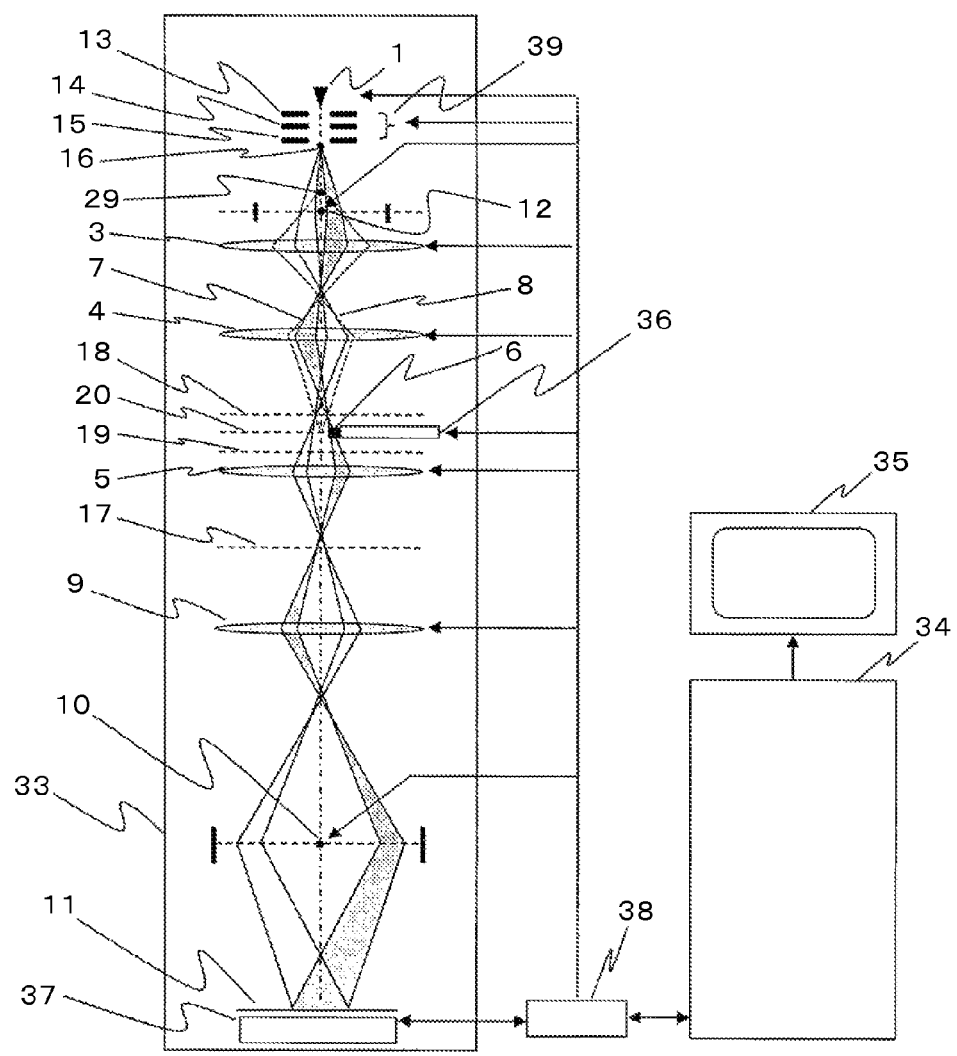
FIG. 3 is a schematic diagram illustrating an example of an interference electron microscope pertaining to the principle configuration and a first embodiment of the present invention.

In FIG. 3, an electron source 1 is situated on an uppermost stream part of an electron beam flowing direction, voltages are applied to a first extraction electrode 13, a second extraction electrode 14 and an acceleration electrode 15, and an electron beam emitted from the electron source 1 is accelerated and converged onto a first electron source 16. In the specification, the first extraction electrode 13, the second extraction electrode 14 and the acceleration electrode 15 will be defined as an acceleration tube 39 all in one piece. The wavelength and track of the electron beam are changed by controlling the applied voltages. Therefore, the electro-optical first electron source 16 is illustrated afresh in the drawing. The electron source 16 is not necessarily a real image.

In the present configuration, a mask 29 is situated downstream of the first electron source 16 in the electron beam flowing direction, that is, between the acceleration tube 39 and a first illumination electron lens 3. Then, the electron beam is deflected inward relative to an optical axis by a first electron biprism 12 which is disposed in a shadow that the mask 29 forms and is directed toward the first illumination electron lens 3. Current densities of an electron beam 7 which is transmitted through a first region where a sample 6 is placed and an electron beam 8 which passes through a second region where the sample 6 is not placed on a sample surface 20 are controlled by actions of the first illumination electron lens 3 and a second illumination electron lens 4 and the two electron beams 7 and 8 are respectively radiated to the two regions on the sample surface 20. The mask 29 is imaged on the sample surface 20 by a lens action of an illumination-lens system and Fresnel fringes are not generated from the mask 29 and the first electron biprism 12 which is disposed in the shadow of the mask 29 on the sample surface 20.

An image of the sample 6 is imaged by an objective lens 5 which is disposed downstream of the sample 6. This imaging action is handed over to a magnifying lens 9 which is disposed downstream of the objective lens 5 and the image is finally imaged on an observation surface 11 of the interference electron microscope utilizing the transmission electron microscope which is the electron beam device. Incidentally, 17 denotes a second electron source surface on which the first electron source 16 is to be imaged.

Then, the electron beam 7 which has passed through the sample surface 20, that is, has been transmitted through the sample 6 placed in the first region and the electron beam 8 which has passed through the second region are deflected by an electron biprism 10 disposed in a region of a shadow that the first electron biprism 12 forms relative to the optical axis and are superposed on the observation surface 11 of the interference electron microscope and interfer each other, and thereby a hologram is obtained. The obtained hologram is detected by an electron beam detector 37 such as an electron microscope film, a CCD camera or the like.

In the interference electron microscope illustrated in FIG. 3, voltages respectively applied to the electron source 1 and the acceleration tube 39, excitation states of a sample micro moving mechanism 36 and electron lenses, and voltages applied to electron biprisms are controlled by a control system 38 connected to a control personal computer (PC) 34. In the actual interference electron microscope, a deflection system for changing the electron beam traveling direction, a diaphragm mechanism for restricting a region through which the electron beam is transmitted and others are included in addition to the elements illustrated in the schematic diagram of FIG. 3 and these elements are also controlled by the control system 38 connected to the control PC 34. However, since these elements have no direct relation to the interference electron microscope disclosed in the present specification, illustration thereof in the drawing is omitted.

Incidentally, the control PC 34 has a general computer configuration including a central processing unit (CPU) which is a processing unit, a memory which is a storage unit, an input/output interface and others which are mutually connected. In this specification, the PC 34 and the control system 38 which control the device are sometimes called a control unit of the device all in one piece. Incidentally, it is not required to configure the control unit by one computer and, for example, such a configuration is possible that a computer for controlling the electron biprism is provided separately from a computer or computers for controlling other elements included in the interference electron microscope. In the above-mentioned case, a plurality of computers will be referred to as a control unit all in one piece. In addition, as illustrated in the schematic diagram of FIG. 3, electro-optical elements are assembled in a microscope body 33 which is a vacuum container and the container is continuously evacuated by a vacuum pump. A vacuum system has no direct relation to the interference electron microscope of the present invention and therefore illustration and description thereof are omitted.

A combination of the interference electron microscope configured as mentioned above with a holography electron microscope that a plurality of biprisms are installed between the sample and an electron beam detector in place of one biprism allows arbitrary adjustment of a spacing of the interference fringes and a width of the interference region. Details of the holography electron microscope which includes the plurality of biprisms are disclosed, for example, in Japanese Patent Application Laid-Open Nos. 2006-216345 and 2006-313069 invented by the inventors and others of the present application and therefore description thereof is omitted here.

In FIG. 3, an electro-optical electron source surface 18 is a surface on which the first electron source 16 is to be imaged by lens actions of the third illumination electron lens 3 and the fourth illumination electron lens 4, an electro-optical first filament electrode surface 19 is a surface on which a filament electrode of the first electron biprism 12 is to be imaged by the lens actions of the third illumination electron lens 3 and the fourth illumination electron lens 4, and the electro-optical sample surface 20 is equal to a surface on which the sample 6 is actually present.

Figure 4:
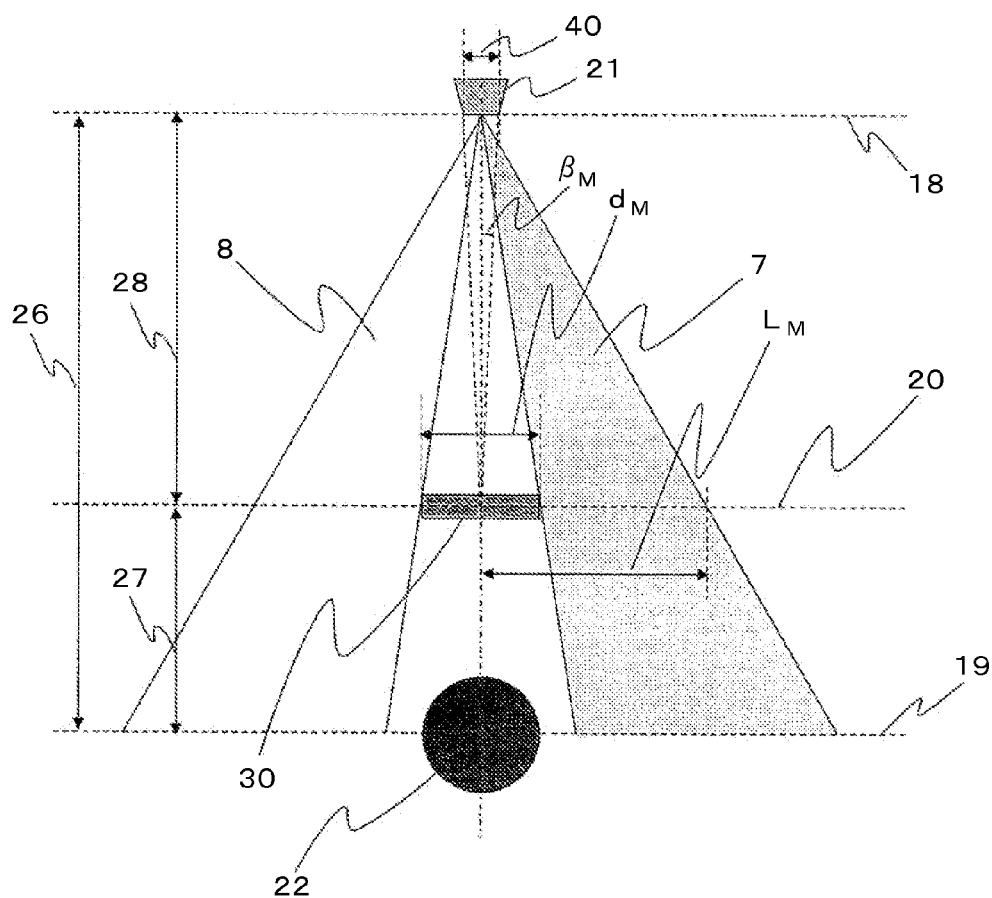
FIG. 4 is a schematic diagram illustrating an example of a positional relationship among electro-optical light source, electron biprism and sample in relation to the principle of the present invention.

FIG. 4 illustrates an example of a relationship among the electro-optical electron source surface 18, the electro-optical first filament electrode surface 19 and the electro-optical sample surface 20.

In FIG. 4, an electro-optical electron source 21 is situated on the electro-optical electron source surface 18, an electro-optical mask 30 is situated on the electro-optical sample surface 20, and an electro-optical first electron biprism 22, the angle of aperture $\beta_M$ of the electro-optical electron source 21 relative to the electro-optical mask surface 20, the coherence length $L_M$ of the electron wave on an electro-optical mask surface, the width $d_M$ of the electro-optical mask 30, a length 26 between the electro-optical electron source 21 and the electro-optical first filament electrode surface 19, a length 27 between the electro-optical first filament electrode surface 19 and the electro-optical sample surface 20 and a length 28 between the electro-optical electron source surface 18 and the electro-optical sample surface 20 are indicated.

In the configurations illustrated in FIG. 3 and FIG. 4, the current densities of the electron beam 7 transmitted through the sample 6 placed in the first region and the electron beam 8 passing through the second region on the sample surface are controlled by the actions of the first illumination electron lens 3 and the second illumination electron lens 4. Then, the length 28 between the electro-optical electron source surface 18 and the electro-optical sample surface 20, the length 27 between the electro-optical first filament electrode surface 19 and the electro-optical sample surface 20 and the length 26 between the electro-optical electron source 21 and the electro-optical first filament electrode surface 19 are controlled and the angle of aperture $\beta_M$ of the electro-optical electron source 21 relative to the electro-optical mask surface is controlled so as to have the relationship meeting the above-mentioned expression (3) where $\lambda$ is the wavelength of the electron beam, $\beta_M$ is the angle of aperture of the electro-optical electron source relative to the electro-optical mask surface and $d_M$ is the width of the electro-optical mask.

Instead of the above, the current densities of the electron beam 7 transmitted through the sample placed in the first region and the electron beam 8 passing through the second region on the sample surface are controlled by the actions of the first illumination electron lens 3 and the second illumination electron lens 4 so as to have the relationship meeting the above-mentioned expression (4) where $L_M$ is the coherence length of the electron wave on the electro-optical sample surface and $d_M$ is the width of the electro-optical mask.

In addition, the current densities of the electron beam 7 transmitted through the sample placed in the first region and the electron beam 8 passing through the second region on the sample surface are controlled by the actions of the first illumination electron lens 3 and the second illumination electron lens 4 so as to have the relationship meeting the above-mentioned expression (5) where L2 is the length 27 between the electro-optical first filament electrode surface and the electro-optical sample surface.

Figure 5A:
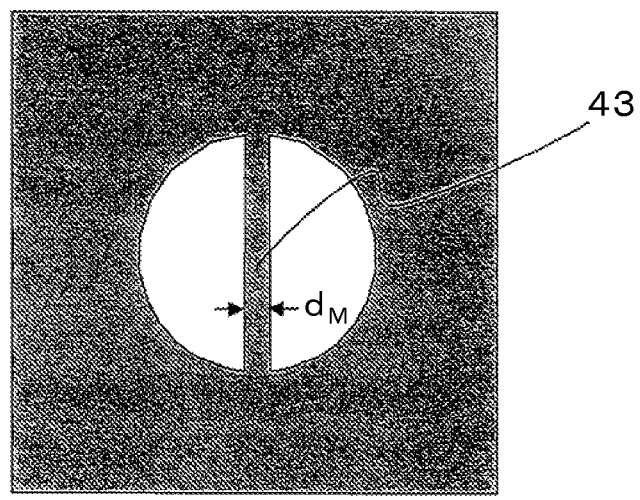
FIG. 5A and FIG. 5B are diagrams, each illustrating an example of a bridged mask of the interference electron microscope according to the first embodiment.
Figure 5B:
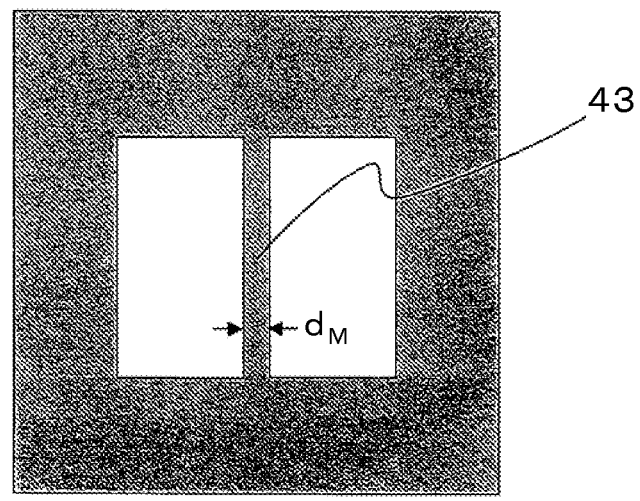

FIG. 5A and FIG. 5B each schematically illustrates one example of the shape of a mask 43 on a plane vertical to the electron beam traveling direction in the configuration of the interference electron microscope illustrated in FIG. 3. FIG. 5A illustrates one example that the bridged mask 43 is placed on the center of a circular hole and FIG. 5B illustrates another example that the bridged mask 43 is placed on the center of a square hole. FIG. 5A and FIG. 5B are schematic diagrams illustrating two examples of the mask 43 which is placed to prevent the filament electrode of the electron biprism from being exposed to the electron beam. However, the shapes of the mask are not limited to those illustrated in FIG. 5A and FIG. 5B in the interference electron microscope described in this specification.

According to the above-mentioned preferred embodiments of the interference electron microscope of the present invention, the electron beam is split by the first electron biprism which is disposed between the acceleration tube and the illumination-lens system or in the illumination-lens system so as to be disposed in the shadow that the mask forms, the in-plane length between the electron beam 7 transmitted through the first region (the sample) and the electron beam 8 passing through the second region on the sample surface is increased while maintaining coherency, the current densities of the electron beam 7 transmitted through the sample placed in the first region and the electron beam 8 passing through the second region on the on the sample surface are controlled by the action of the illumination-lens system, and the electron beam 7 and the electron beam 8 are superposed on the observation surface by the second electron biprism of the imaging lens system. Therefore, it becomes possible to obtain the high-contrast hologram.

In addition, it is allowed to observe with high magnification an inner region viewed from an edge of a thin film sample observation of which is difficult by an existing electron holography and it is also allowed to obtain the high contract hologram at high current densities, thereby reducing the noise of a phase-recovered image in phase-recovering the hologram and attaining high precision phase analysis. Owing to provision of the mask which is imaged on the sample surface by the lens action of the illumination-lens system, the Fresnel fringes which would be an obstacle in phase analysis are not generated from the first electron biprism.

In addition, As countermeasure against the disadvantage that phase analysis accuracy is reduced when electrostatic charge which occurs by radiating the electron beam to the sample adversely affects the electron beam 8 passing through the second region to distort the interference fringes and when the magneto-static leakage field caused by the sample which is large in magneto-static leakage field adversely affects the electron beam 8 passing through the second region to distort the interference fringes in obtaining the hologram, it becomes possible to adjust and increase the in-plane length between the electron beam 7 transmitted through the sample placed in the first region and the electron beam 8 passing through the second region on the sample surface. It becomes possible to obtain the phase-recovered image which is higher in precision than that of the existing electron holography also in the above-mentioned case.

The above-mentioned principle configuration is also applicable to interference electron microscopes other than that illustrated in FIG. 3. In the following, various embodiments of the present invention will be described with reference to the accompanying drawings.

[First Embodiment]

FIG. 3 is a diagram schematically illustrating an example of an optical system of the interference electron microscope according to the first embodiment of the present invention as described above.

Figure 1A:
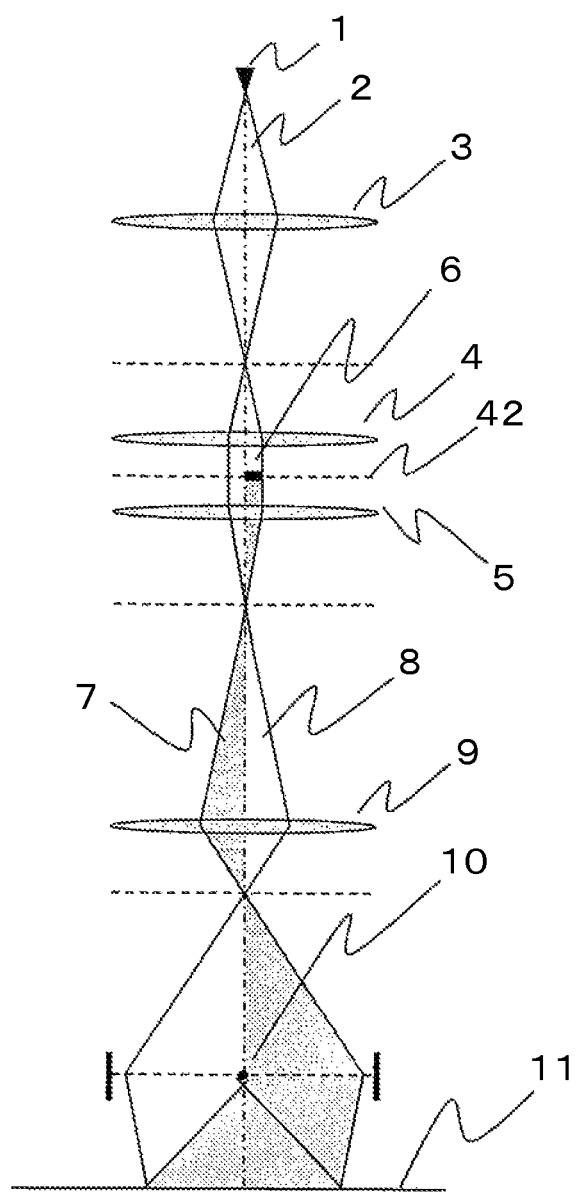
FIG. 1A is a schematic diagram illustrating one example of an electron beam device by an existing method.
Figure 1B:
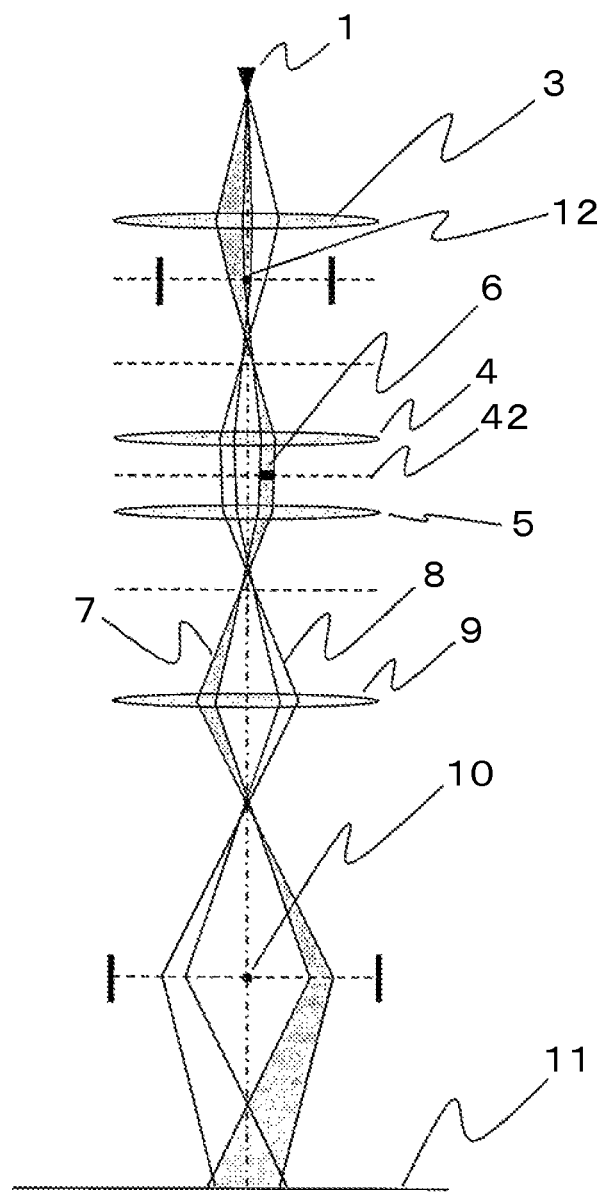
FIG. 1B is a schematic diagram illustrating another example of an electron beam device by an existing method.
Figure 2:
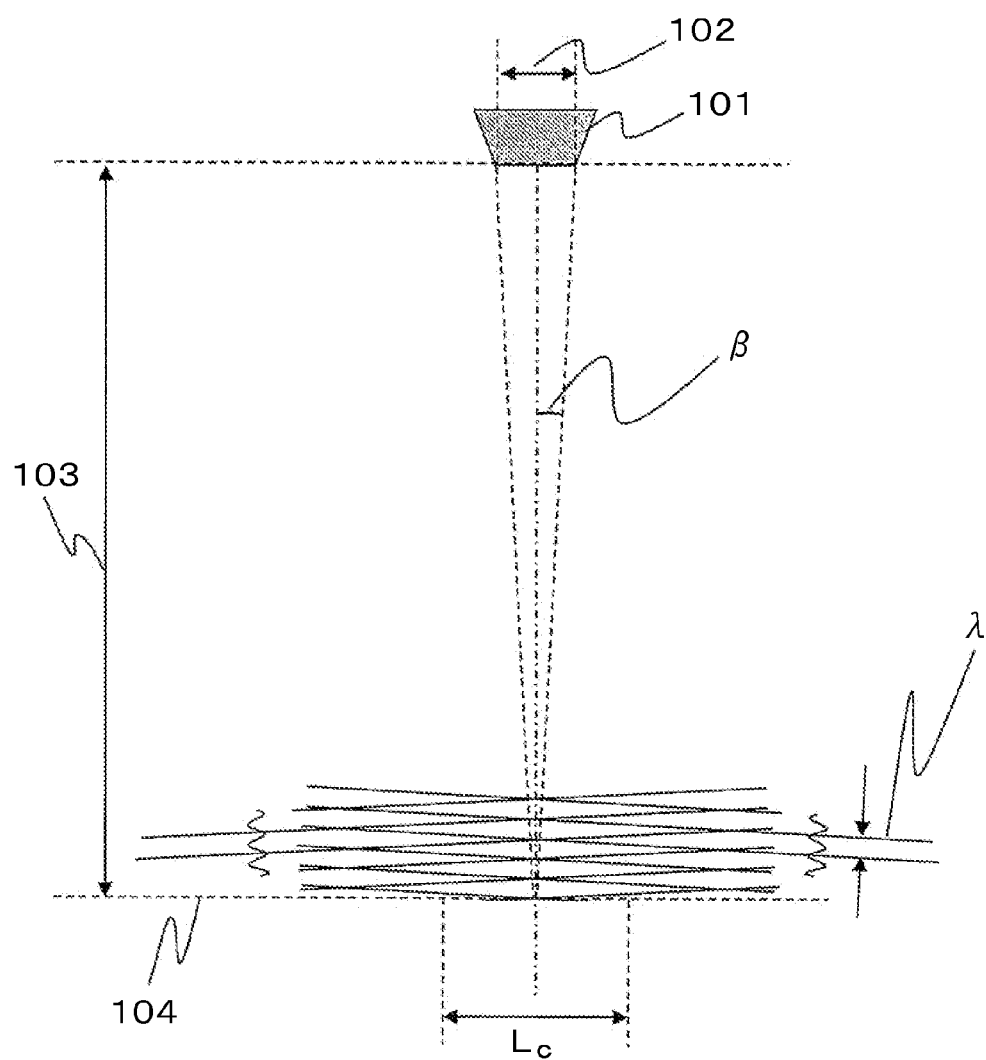
FIG. 2 is a schematic diagram illustrating an example of an electron beam coherence length pertaining to a principle configuration of the present invention.

In FIG. 1, the electron source 1 is situated on the uppermost stream part of the electron beam flowing direction, the voltages are applied to the first extraction electrode 13, the second extraction electrode 14 and the acceleration electrode 15, and the electron beam emitted from the electron source 1 is accelerated to form the first electron source 16.

The electron beams are deflected relative to the optical axis by the first electron biprism 12 which is disposed in the shadow formed by the mask 29 situated between the acceleration tube 39 and the first illumination electron lens 3 and is situated between the acceleration tube 39 and the first illumination electron lens 3 downstream of the first electron source 16 in the electron beam flowing direction and are directed toward the first illumination electron lens 3.

The current densities and positions of the electron beam 7 transmitted through the first region (the sample) and the second electron beam 8 passing through the second region on the sample surface are controlled by the actions of the first illumination electron lens 3 and the second illumination electron lens 4, and the two electron beams are respectively radiated to the two regions on the sample surface.

In the above-mentioned case, the mask 29 is imaged on the sample surface by the action of the illumination-lens system and the Fresnel fringes are not generated on the sample surface. Although an invention configured such that generation of the Fresnel fringes on the sample surface is prevented by disposing the electron biprism in the shadow formed by the mask which is disposed between the acceleration tube 39 and the sample is described in Japanese Patent Application Laid-Open No. 2011-040217 that the inventors and others of the present invention have filed before, the present invention is different from the invention disclosed in Japanese Patent Application Laid-Open No. 2011-040217 in that in the configuration of the present embodiment, the electron beam is split into two electron beams and the two electron beams are radiated to different regions on the sample surface, while in the configuration of the invention disclosed in Japanese Patent Application Laid-Open No. 2011-040217, the electron beams are radiated to the same region on the same sample surface.

In the present invention, the relationship between the coherence length at the position of the mask and the width of the mask is not changed by the lens action of the illumination-lens system. Therefore, a device user of the interference electron microscope needs only pay attention to control of the density of illumination current and illumination position and therefore the microscope according to this embodiment is high in operability. In addition, it is allowed to project the mask on the sample surface in the contracted state by the lens actions of the plurality of lenses of the illumination-lens system and therefore it is also allowed to reduce the shadow of the mask on the sample surface.

In the configuration in FIG. 3, it is allowed to apply an arbitrary potential to the first electron biprism 12 by the control system 38 connected to the control PC 34 and therefore arbitrary control of the length between the electron beam 7 transmitted through the sample placed in the first region and the electron beam 8 passing through the second region on the sample surface is allowed. The length between the electron beam 7 transmitted through the first region (the sample) and the electron beam 8 passing through the second region on the sample surface at the position of the sample 6 may be also controlled by the lens action of the illumination-lens system.

In a device configuration that the number of illumination electron lenses is further increased so as to have a plurality of the illumination electron lenses, it is allowed to increase a control range of the length between the electron beam 7 transmitted through the first region (the sample) and the electron beam 8 passing through the second region on the sample surface and an adjustment range of the current densities of the respective electron beams at the position of the sample 6.

In addition, in case of an electromagnetic lens, in changing the lens action of the illumination-lens system in order to change the current densities on the sample surface, since the electron beams are converged while helically rotating within the microscope, the positional relationship between the electron beam 7 transmitted through the first region (the sample) and the electron beam 8 passing through the second region at the position of the sample is changed with rotation in a plane and therefore the length between them is changed. In order to avoid such an in-plane change in positional relationship between the electron beam 7 transmitted through the first region (the sample) and the electron beam 8 passing through the second region on the sample surface with rotation independently of a change in current densities on the sample surface, the biprism may be rotated (oriented) in a plane vertical to the optical axis in cooperation with lens current of the illumination-lens system.

Since this cooperative relationship is settled inherently to each device, a data file for each cooperating operation is stored in the control PC 34, the data file is invoked simultaneously with changing the lens current of the illumination-lens system, and thereby it is allowed to rotate (orient) the first electron biprism in a direction which is registered in the data file and by an amount which is registered in the data file by the control system 38. Owing to the above-mentioned control, the user is allowed to change the current densities of the electron beams on the sample surface with no stress and to readily maintain the positional relationship between the electron beam 7 transmitted through the sample placed in the first region and the electron beam 8 passing through the second region at the position of the sample in the sample in-plane rotation direction.

The image of the sample 6 is imaged by the objective lens disposed downstream of the sample 6 in the electron beam traveling direction. This imaging action is handed over to the magnifying lens 9 disposed downstream of the objective lens 5 and it is finally imaged on the observation surface 11 of the interference electron microscope.

In addition, the electron beam 7 which has passed through the sample surface 20, that is, has been transmitted through the sample 6 placed in the first region and the electron beam 8 which has passed through the second region are deflected by the electron biprism 10 disposed in the region of the shadow that the first electron biprism 12 forms relative to the optical axis, are superposed on the observation surface 11 of the interference electron microscope and interfer each other, and thereby an interference image is obtained. The obtained interference image is detected by the electron beam detector 37 such as an electron microscope film, a CCD camera or the like.

The voltages respectively applied to the electron source 1 and the acceleration tube 39, the excitation states of the sample micro moving mechanism 36 and the electron lens, and the voltage applied to the electron biprism are controlled by the control system 38 connected to the control PC 34. In the actual interference electron microscope, the deflection system for changing the electron beam traveling direction, the diaphragm mechanism for restricting the region through which the electron beam is transmitted and others are included in addition to the elements illustrated in the schematic diagram of FIG. 3 and these elements are also controlled by the control system 38 connected to the control PC 34. However, since these elements has no direct relation to the present application, illustration thereof in the drawing is omitted. Incidentally, the electro-optical elements are assembled in the microscope body 33 which is the vacuum container and the vacuum container is continuously evacuated by the vacuum pump as illustrated in the schematic diagram. However, since the vacuum system has no direct relation to the present application, illustration and description thereof are omitted.

In addition, a plurality of not illustrated magnifying lenses and a plurality of not illustrated biprisms may be installed between the sample and the observation surface 11 and an arbitrary interference condition may be prepared by using them. As for the holography electron microscope that the plurality of biprisms are installed between the sample and the electron beam detector 22, since details thereof are disclosed in Japanese Patent Application Laid-Open No. 2006-313069 as described above, it is not described here. However, it is also effective to rotate (orient) each biprism of the imaging lens system in cooperation with lens current of the imaging lens system also in the imaging lens system as described about the possibility that a specific interference condition is stably provided by making the lens current of the illumination-lens system cooperate with rotation (orientation) of the biprism thereof. These cooperative conditions are stored in the control PC 34 and are invoked as required, thereby performing an appropriate operation.

In a device configuration that the number of magnifying lenses is further increased so as to include a plurality of the magnifying lenses, it is allowed to increase ranges within which magnification, a positional relationship between the filament electrode of the electron biprism in the imaging lens system and an image surface and a relationship between the filament electrode of the electron biprism in the imaging lens system and a position where the electron beams are converged and therefore arbitrary control of the magnification for observation, the spacing of interference fringes and the width of interference region is allowed. Since details of the device configuration of the imaging-lens system and control thereof are described in WO 2010/026867, detailed description thereof is omitted here. The interference fringes detected by the electron beam detector 37 are soon reproduced by the control PC 34 via the control system 38 or are temporarily saved in the control PC 34 and then reproduced and a reproduced image is displayed on a monitor 35. Since an already established reproducing method is well known, detailed description thereof is omitted here.

[Second Embodiment]

Figure 6:
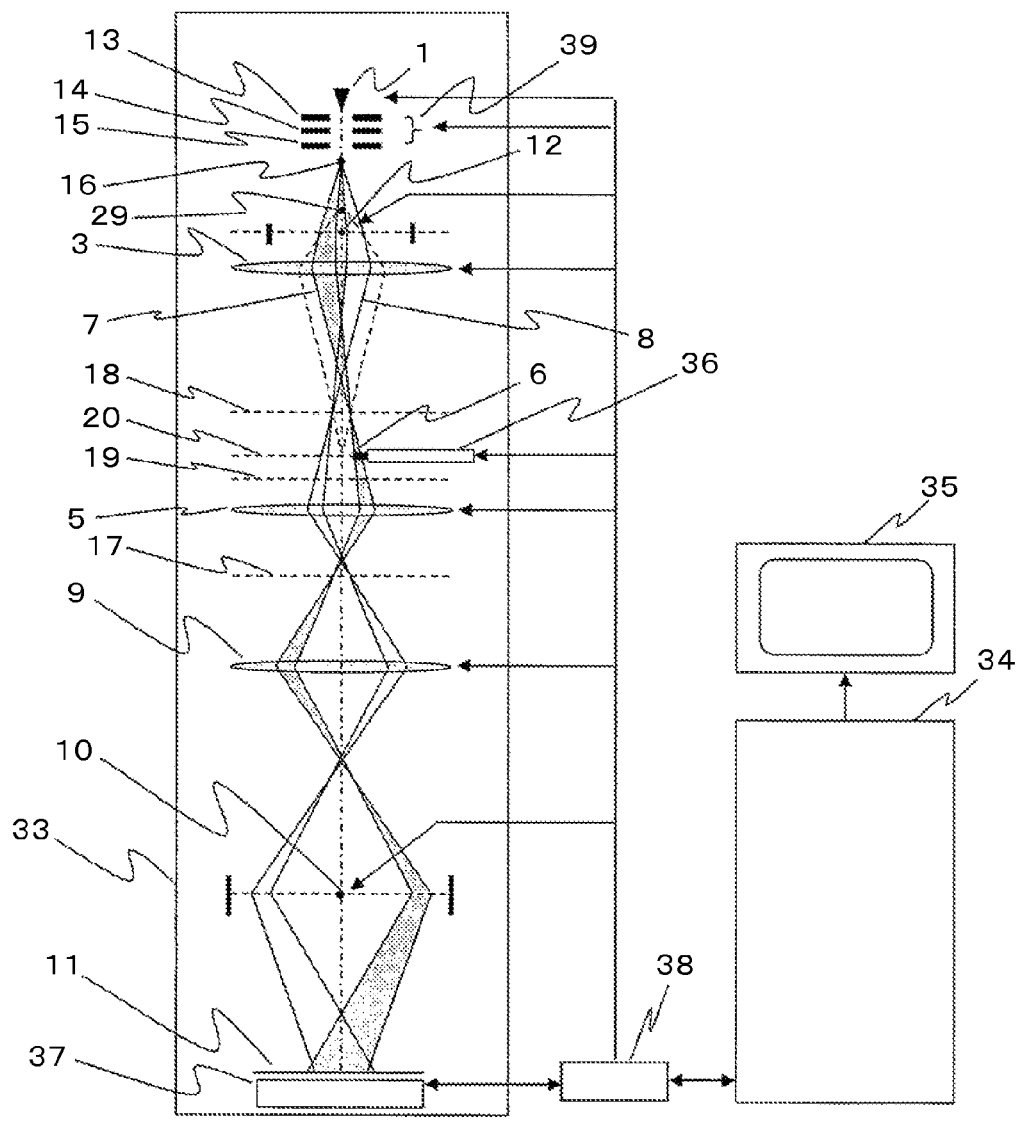
FIG. 6 is a schematic diagram illustrating an example of an interference electron microscope according to a second embodiment that a mask, a first electron biprism, a first illumination electron lens and a sample are arranged in order.

FIG. 6 is a schematic diagram illustrating an example of an interference electron microscope according to the second embodiment of the present invention. The interference electron microscope of the present embodiment includes the mask, the first electron biprism, the first illumination electron lens and the sample in order. Since the configuration of the microscope device according to the second embodiment is similar to that of the first embodiment, description of the same parts as those in the first embodiment is omitted and only different parts of the device configuration will be described.

The electron beam are deflected relative to the optical axis by the first electron biprism 12 which is disposed in the shadow formed by the mask 29 situated between the acceleration tube 39 and the first illumination electron lens 3 and situated between the acceleration tube 39 and the first illumination electron lens 3 downstream of the first electron source 16 in the electron beam flowing direction and are directed toward the first illumination electron lens 3. The current densities and positions of the electron beam 7 transmitted through the first region (the sample) and the electron beam 8 passing through the second region on the sample surface are controlled by the action of the first illumination electron lens 3 and the two electron beams are respectively radiated to the two regions on the sample surface. In the above-mentioned case, the mask 29 is imaged on the sample surface by the action of the illumination-lens system and the Fresnel fringes are not generated on the sample surface.

The second embodiment has a configuration which implements the principle of the present invention most simply. In addition, since the relationship between the coherence length at the position of the mask and the width of the mask is not changed by the lens action of the lens of the illumination-lens system. Therefore, the device user of the interference electron microscope needs only pay attention to control of the density of illumination current and the illumination position and therefore the microscope according to this embodiment is high in operability. The gist of the present embodiment lies in that the first electron biprism is positioned between the mask 29 and the sample 6 and it is not limited to only the device configuration illustrated in FIG. 6.

[Third Embodiment]

Figure 7:
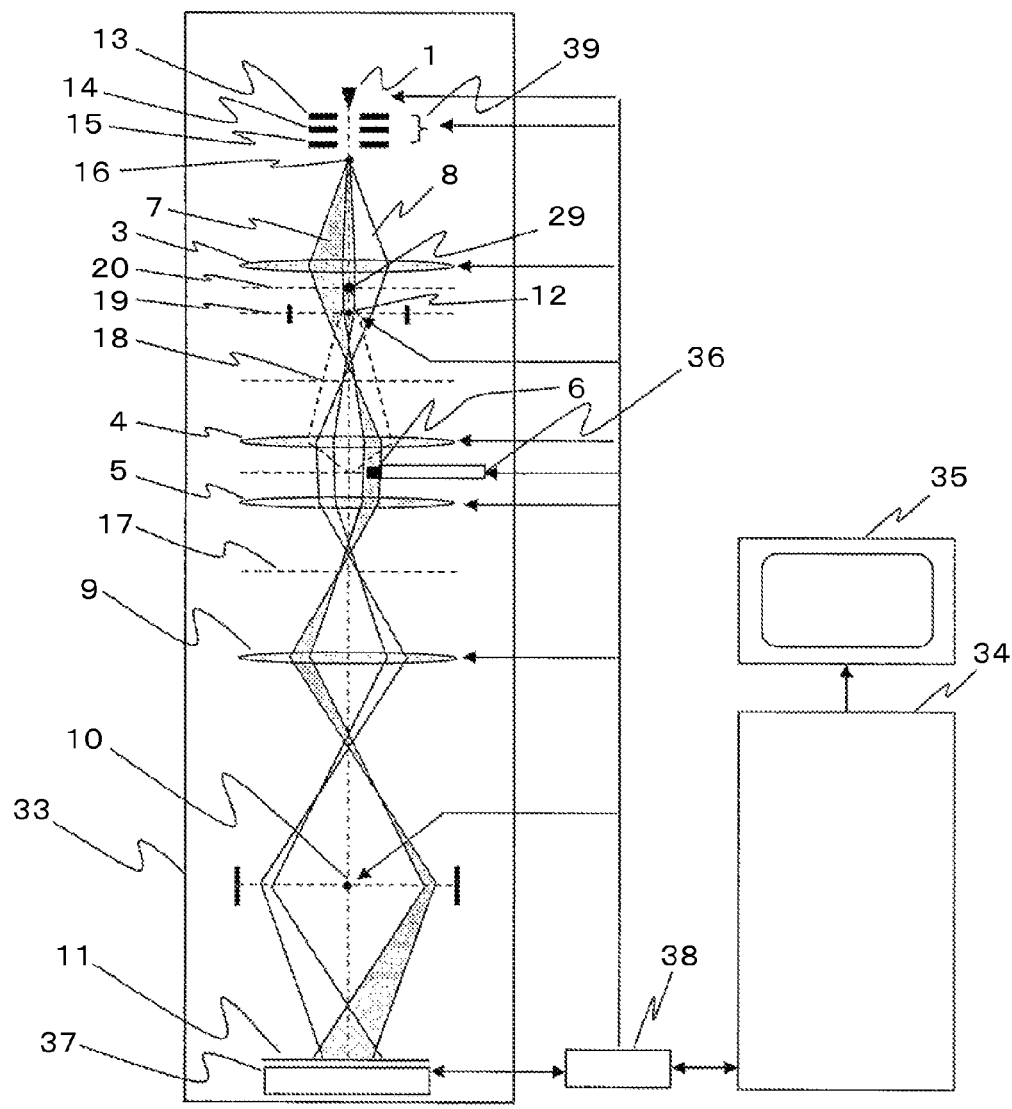
FIG. 7 is a schematic diagram illustrating an example of an interference electron microscope according to a third embodiment that the first illumination electron lens, the mask, the first electron biprism, a second illumination electron lens and the sample are arranged in order.

FIG. 7 is a schematic diagram illustrating an example of an interference electron microscope according to the third embodiment of the present invention. The interference electron microscope according to the third embodiment includes the first illumination electron lens, the mask, the first electron biprism, the second illumination electron lens and the sample in order. Since the configuration of the microscope device is similar to that in the first embodiment, description of the same parts as those in the first embodiment is omitted and only different parts in the device configuration will be described here.

The first illumination electron lens 3, the mask 29, the first electron biprism 12, the second illumination electron lens 4 and the sample 6 are arranged in order downstream of the first electron source 16 in the electron beam flowing direction.

The electron beams are deflected relative to the optical axis by the first electron biprism 12 which is disposed in the shadow formed by the mask 29 situated between the first illumination electron lens 3 and the second illumination electron lens 4 or between the acceleration tube 39 and the first illumination electron lens 3 and is situated between the first illumination electron lens 3 and the second illumination electron lens 4 and are directed toward the second illumination electron lens 4. The current densities and positions of the electron beam 7 transmitted through the first region (the sample) and the electron beam 8 passing through the second region on the sample surface are controlled by the actions of the first illumination electron lens 3 and the second illumination electron lens 4 and the two electron beams are respectively radiated to the two regions on the sample surface.

In the above-mentioned case, the mask 29 is imaged on the sample surface by the action of the illumination-lens system and the Fresnel fringes are not generated on the sample surface.

In the present embodiment, almost parallel radiation of the electron beams to the sample is made possible by the action of the second illumination electron lens 4.

[Fourth Embodiment]

Figure 8:
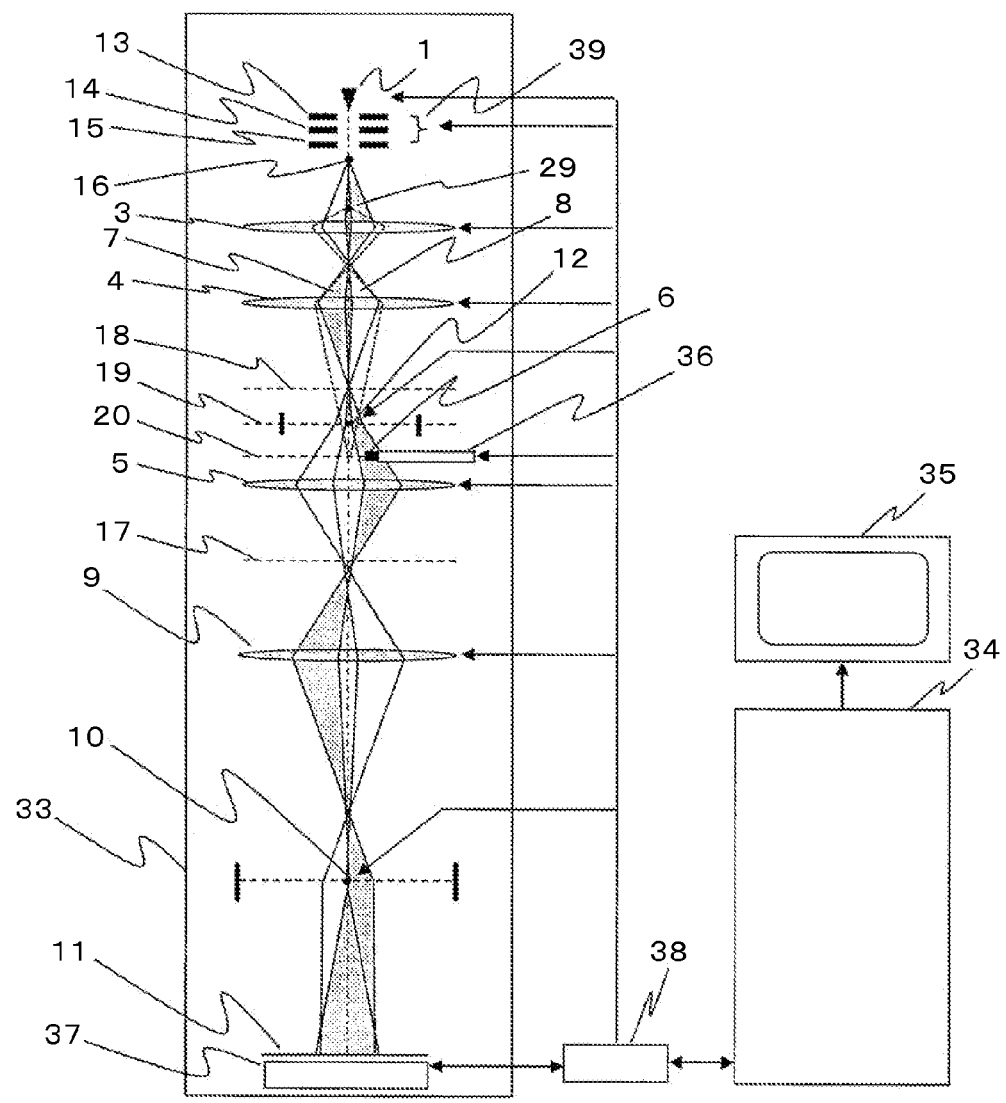
FIG. 8 is a schematic diagram illustrating an example of an interference electron microscope according to a fourth embodiment that the mask, the first illumination electron lens, the second illumination electron lens, the first electron biprism and the sample are arranged in order.

FIG. 8 is a schematic diagram illustrating an example of an interference electron microscope according to the fourth embodiment. The interference electron microscope according to the fourth embodiment includes the mask, the first illumination electron lens, the second illumination electron lens, the first electron biprism and the sample in order. Since the configuration of the microscope device is similar to that in the first embodiment, description of the same parts as those in the first embodiment is omitted and only different points in the device configuration will be described here. The mask 29, the first illumination electron lens 3, the second illumination electron lens 4, the first electron biprism 12 and the sample 6 are arranged in order downstream of the first electron source 16 in the electron beam flowing direction.

The electron beams are deflected relative to the optical axis by the first electron biprism 12 which is disposed in the shadow formed by the mask 29 situated between the acceleration tube 39 and the first illumination electron lens 3 or between the first illumination electron lens 3 and the second illumination electron lens 4 and is situated between the second illumination electron lens 4 and the sample 6, the positions of the electron beam 7 transmitted through the first region (the sample) and the electron beam 8 passing through the second region on the sample surface are controlled and the electron beams are directed toward the sample 6. The current densities of the electron beam 7 transmitted through the first region (the sample) and the electron beam 8 passing through the second region on the sample surface are controlled by the actions of the first illumination electron lens 3 and the second illumination electron lens 4 and the two electron beams are respectively radiated to the two regions on the sample surface.

In the above-mentioned case, the mask 29 is imaged on the sample surface by the action of the illumination-lens system and the Fresnel fringes are not generated on the sample surface.

In this embodiment, since the relationship between the sample and the biprism is not changed, a split width on the sample surface relative to the voltage applied to the first electron biprism is maintained constant, which is convenient for the user of the interference electron microscope when controlling the split width. In addition, the effect of the present invention is readily obtained in an interference electron microscope having a structure that the biprism is loaded on a sample holder on the basis of an interference electron microscope having no port for setting the biprism in the illumination-lens system as in the existing electron microscope.

Incidentally, the same effect as the above is obtained by arranging in order the mask 29, the first illumination electron lens 3, the first electron biprism 12, the second illumination electron lens 4 and the sample 6 downstream of the first electron source 16 in the electron beam flowing direction as a modified embodiment based on the present embodiment. In the above-mentioned case, it is allowed to control the positions of the electron beam 7 transmitted through the first region (the sample) and the electron beam 8 passing through the second region on the sample surface by combining the action of the second illumination electron lens 4 with the action of the first electron biprism 12.

[Fifth Embodiment]

Figure 9:
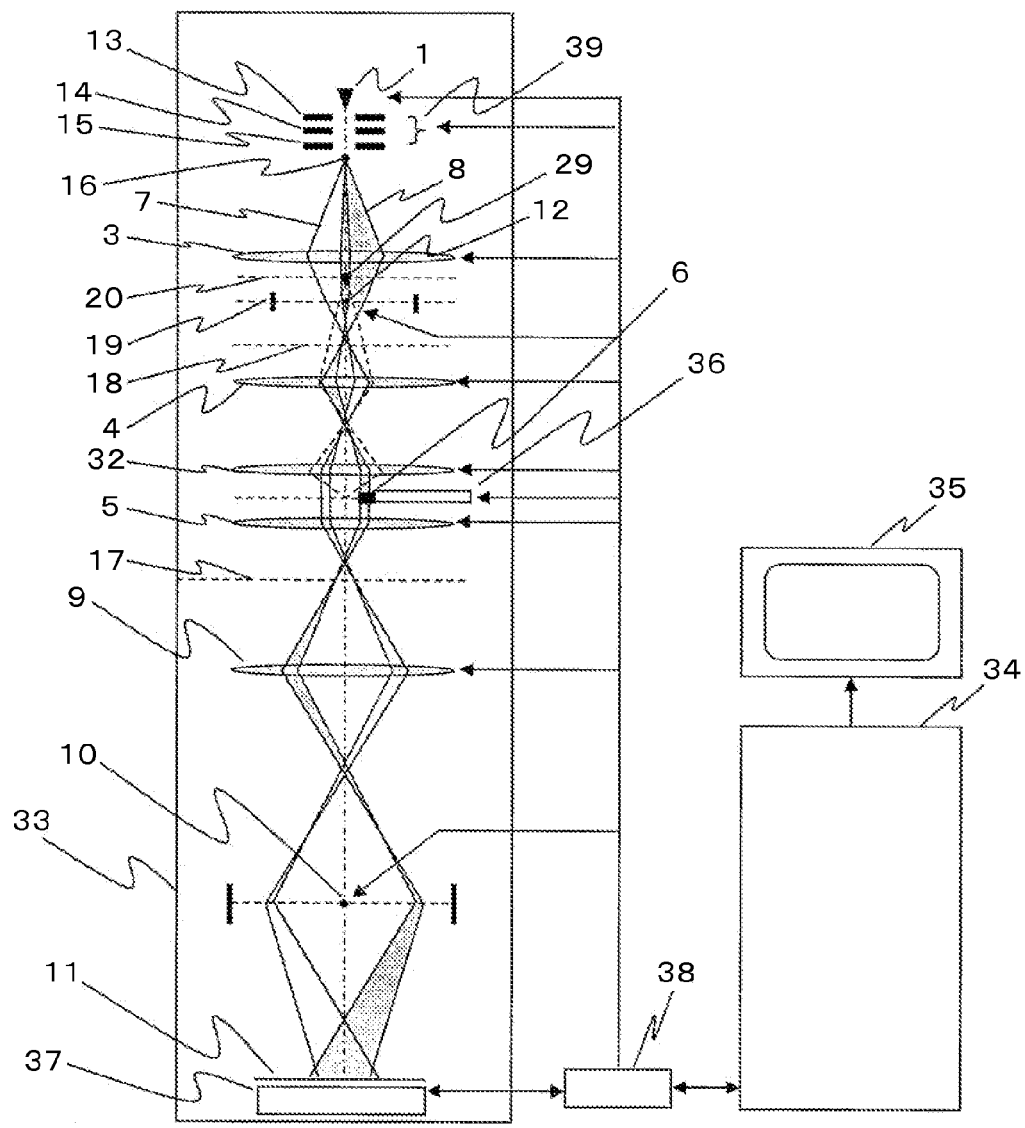
FIG. 9 is a schematic diagram illustrating an example of an interference electron microscope according to a fifth embodiment that the first illumination electron lens, the mask, the first electron biprism, the second illumination electron lens, a third illumination electron lens and the sample are arranged in order.

FIG. 9 is a schematic diagram illustrating an example of an interference electron microscope according to the fifth embodiment of the present invention. The interference electron microscope according to the fifth embodiment includes the first illumination electron lens, the mask, the first electron biprism, the second illumination electron lens, a third illumination electron lens and the sample in order. Since the device configuration is similar to that in the first embodiment, description of the same parts as those in the first embodiment is omitted and different points in the device configuration will be described here. The first illumination electron lens 3, the mask 29, the first electron biprism 12, the second illumination electron lens 4, a third illumination electron lens 32 and the sample are arranged in order downstream of the first electron source 16 in the electron beam flowing direction.

The electron beams are deflected relative to the optical axis by the first electron biprism 12 which is disposed in the shadow formed by the mask 29 situated between the acceleration tube 39 and the first illumination electron lens 3 or between the first illumination electron lens 3 and the second illumination electron lens 4 and is situated between the first illumination electron lens 3 and the second illumination electron lens 4 and are directed toward the second illumination electron lens 4. The current densities and positions of the electron beam 7 transmitted through the first region (the sample) and the electron beam 8 passing through the second region on the sample surface are controlled by the actions of the first illumination electron lens 3, the second illumination electron lens 4 and the third illumination electron lens 32 and the two electron beams are respectively radiated to the two regions on the sample surface.

In the above-mentioned case, the mask 29 is imaged on the sample surface by the action of the illumination-lens system and the Fresnel fringes are not generated on the sample surface.

In the present embodiment, it is allowed to control the current densities and positions of the electron beam 7 transmitted through the first region (the sample) and the electron beam 8 passing through the second region on the sample surface by the lens action of the third illumination electron lens 32 after adjusting the coherence length of the electron beam at the position of the mask by the lens action of the first illumination electron lens 3.

[Sixth Embodiment]

Figure 10:
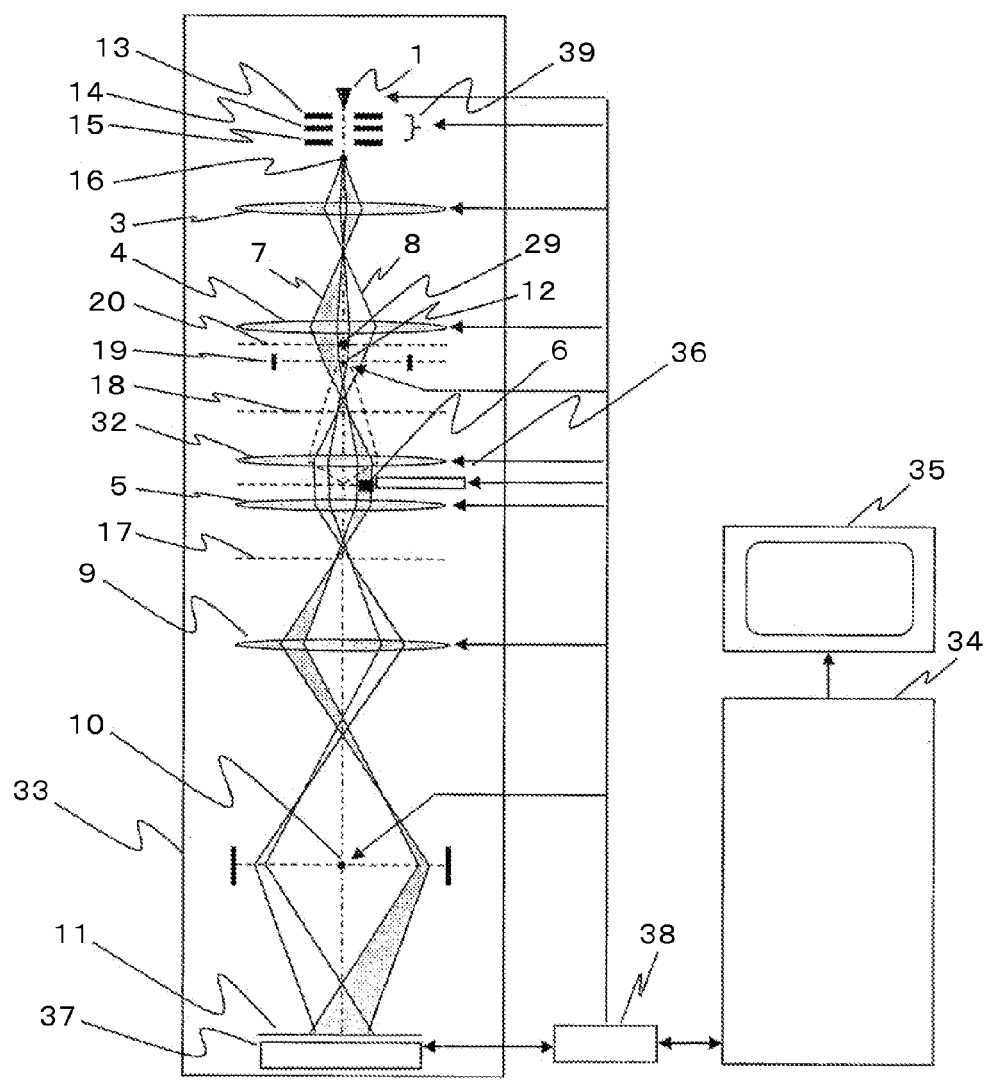
FIG. 10 is a schematic diagram illustrating an example of an interference electron microscope according to a sixth embodiment that the first illumination electron lens, the second illumination electron lens, the mask, the first electron biprism, the third illumination electron lens and the sample are arranged in order.

FIG. 10 is a schematic diagram illustrating an example of an interference electron microscope according to the sixth embodiment of the present invention. The interference electron microscope according to the sixth embodiment includes the first illumination electron lens, the second illumination electron lens, the mask, the first electron biprism, the third illumination electron lens and the sample in order. Since the device configuration is similar to that in the first embodiment, description of the same parts as those in the first embodiment is omitted and different points in the device configuration will be described here. The first illumination electron lens 3, the second illumination electron lens 4, the mask 29, the first electron biprism 12, the third illumination electron lens 32 and the sample are arranged in order downstream of the first electron source 16 in the electron beam flowing direction.

The electron beams are deflected relative to the optical axis by the first electron biprism 12 which is disposed in the shadow formed by the mask 29 situated between the acceleration tube 39 and the first illumination electron lens 3, between the first illumination electron lens 3 and the second illumination electron lens 4 or between the second illumination electron lens 4 and the third illumination electron lens 32 and is situated between the second illumination electron lens 4 and the third illumination electron lens 32 and are directed toward the third illumination electron lens 32.

The current densities and positions of the electron beam 7 transmitted through the first region (the sample) and the electron beam 8 passing through the second region on the sample surface are controlled by the actions of the first illumination electron lens 3, the second illumination electron lens 4 and the third illumination electron lens 32 and the two electron beams are radiated to the two regions on the sample surface. In the above-mentioned case, the mask 29 is imaged on the sample surface by the action of the illumination-lens system and the Fresnel fringes are not generated on the sample surface.

In the present embodiment, it is allowed to adjust the coherence length of the electron beam at the position of the mask without changing the electro-optical electron source surface 18 by the lens actions of the first illumination electron lens 3 and the second illumination electron lens 4.

[Seventh Embodiment]

Figure 11:
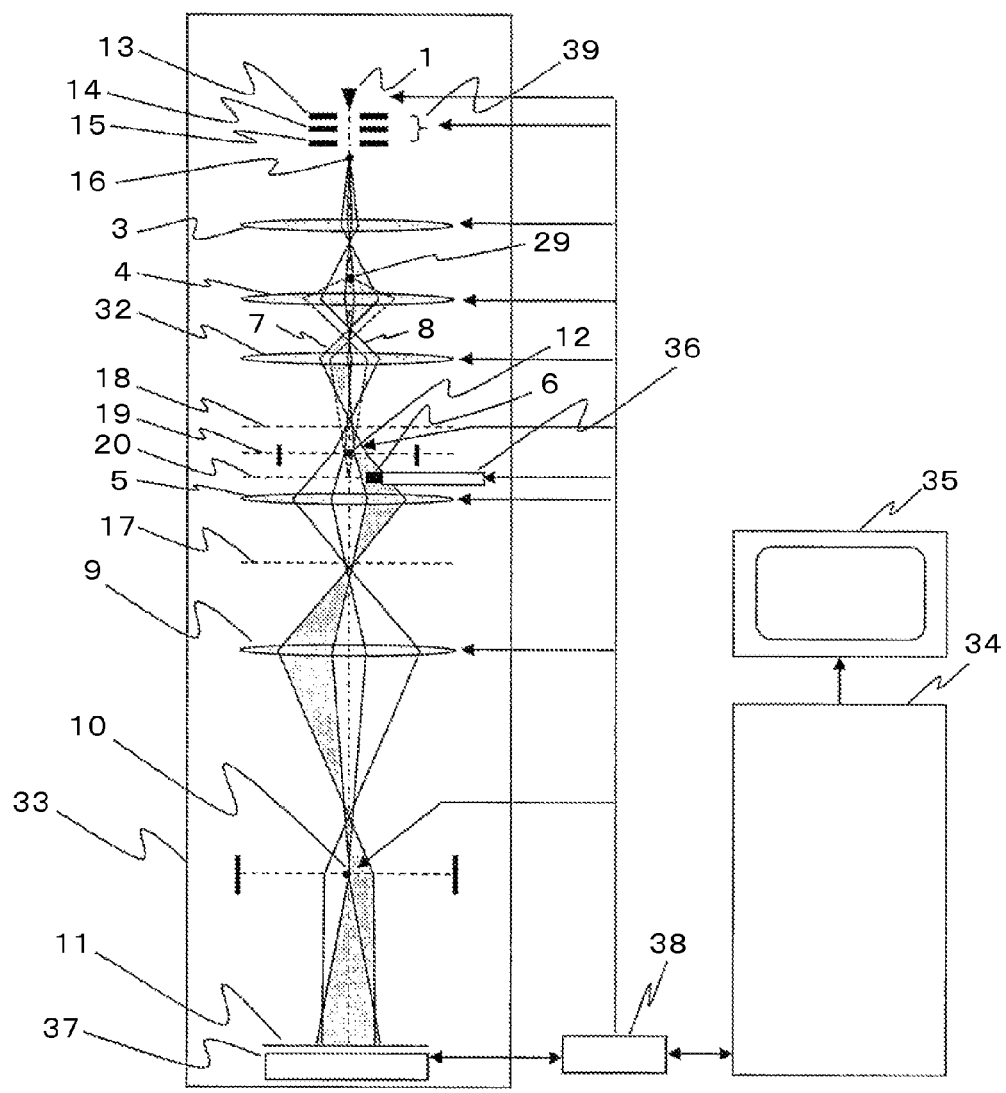
FIG. 11 is a schematic diagram illustrating an example of an interference electron microscope according to a seventh embodiment that the first illumination electron lens, the mask, the second illumination electron lens, the third illumination electron lens, the first electron biprism and the sample are arranged in order.

FIG. 11 is a schematic diagram illustrating an example of an interference electron microscope according to the seventh embodiment of the present invention. The interference electron microscope according to the seventh embodiment includes the first illumination electron lens, the mask, the second illumination electron lens, the third illumination electron lens, the first electron biprism and the sample in order. Since the device configuration is similar to that in the first embodiment, description of the same parts as those in the first embodiment is omitted and different points in the device configuration will be described here. The first illumination electron lens 3, the mask 29, the second illumination electron lens 4, the third illumination electron lens 32, the first electron biprism 12 and the sample are arranged in order downstream of the first electron source 16 in the electron beam flowing direction.

The electron beams are deflected relative to the optical axis by the first electron biprism 12 which is disposed in the shadow formed by the mask 29 situated between the acceleration tube 39 and the first illumination electron lens 3, between the first illumination electron lens 3 and the second illumination electron lens 4 or between the second illumination electron lens 4 and the third illumination electron lens 32 and is situated between the third illumination electron lens 32 and the sample 6, the positions of the electron beam 7 transmitted through the first region (the sample) and the electron beam 8 passing through the second region on the sample surface are controlled and the electron beams are directed toward the sample 6.

The current densities of the electron beam 7 transmitted through the first region (the sample) and the electron beam 8 passing through the second region on the sample surface are controlled by the actions of the first illumination electron lens 3, the second illumination electron lens 4 and the third illumination electron lens 32 and the two electron beams are respectively radiated to the two regions on the sample surface. In the above-mentioned case, the mask 29 is imaged on the sample surface by the action of the illumination-lens system and the Fresnel fringes are not generated on the sample surface.

In this embodiment, since the relationship between the sample and the biprism is not changed, the split width on the sample surface relative to the voltage applied to the first electron biprism is maintained constant, which is convenient for the user of the interference electron microscope when controlling the split width.

In addition, the effect of the present invention is readily obtained in the interference electron microscope having the structure that the biprism is loaded on the sample holder on the basis of the interference electron microscope having no port for setting the biprism in the illumination-lens system as in the existing electron microscope. In addition, since the number of the illumination electron lenses is larger than that in the fourth embodiment, a range of adjusting the coherence length is wider than that in the fourth embodiment.

Incidentally, the effect of the present invention is also obtained by arranging in order the mask 29, the first illumination electron lens 3, the first electron biprism 12, the second illumination electron lens 4, the third illumination electron lens 32 and the sample 6 downstream of the first electron source 16 in the electron beam flowing direction as a modified embodiment based on the present embodiment.

In the above-mentioned case, the mask 29 is imaged between the first illumination electron lens 3 and the second illumination electron lens 4 by the lens action of the first illumination electron lens 3 and the split width of the electron beam at that position is controlled by the action of the first electron biprism 12. It is allowed to radiate the split electron beams onto the sample surface by magnifying or contracting the split electron beams to arbitrary sizes on the surface on which the mask is imaged by the lens actions of the second illumination electron lens 4 and the third illumination electron lens 32.

In addition, the effect of the present invention is also obtained by arranging the mask 29, the first illumination electron lens 3, the second illumination electron lens 4, the first electron biprism 12, the third illumination electron lens 32 and the sample 6 in order downstream of the first electron source 16 in the electron beam flowing direction as another modified embodiment based on the present invention.

In the above-mentioned case, it is allowed to radiate the electron beam onto the sample surface by increasing or decreasing the coherence length of the electron beam to an arbitrary size at the position of the mask 29 by the lens actions of the first illumination electron lens 3, the second illumination electron lens 4 and the third illumination electron lens 32. In the above-mentioned case, since a ratio of the coherence length of the electron beam to the size of the mask 29 is not changed by the action of the illumination-lens system, the device user needs only consider control of the density of illumination current for radiating the electron beam onto the sample surface.

In addition, the effect of the present invention is also obtained by arranging in order the first illumination electron lens 3, the mask 29, the second illumination electron lens 4, the first electron biprism 12, the third illumination electron lens 32 and the sample 6 downstream of the first electron source 16 in the electron beam flowing direction as another modified embodiment based on the present embodiment.

In the above-mentioned case, it is allowed to control the coherence length of the electron beam at the position of the mask 29 by the action of the first illumination lens 3 and it is also allowed to radiate the electron beam onto the sample surface by increasing or decreasing the coherence length of the electron beam to an arbitrary size at the position of the mask 29 by the actions of the second illumination electron lens 4 and the third illumination electron lens 32. In the above-mentioned case, the ratio of the coherence length of the electron beam to the size of the mask 29 which has been once set by the action of the first illumination electron lens 3 is not changed by the actions of second illumination electron lens 4 and the third illumination electron lens 32. Therefore, the device user needs only consider control of the density of illumination current for radiating the electron beam onto the sample surface after setting the ratio of the coherence length of the electron beam to the size of the mask 29.

[Eighth Embodiment]

Figure 12:
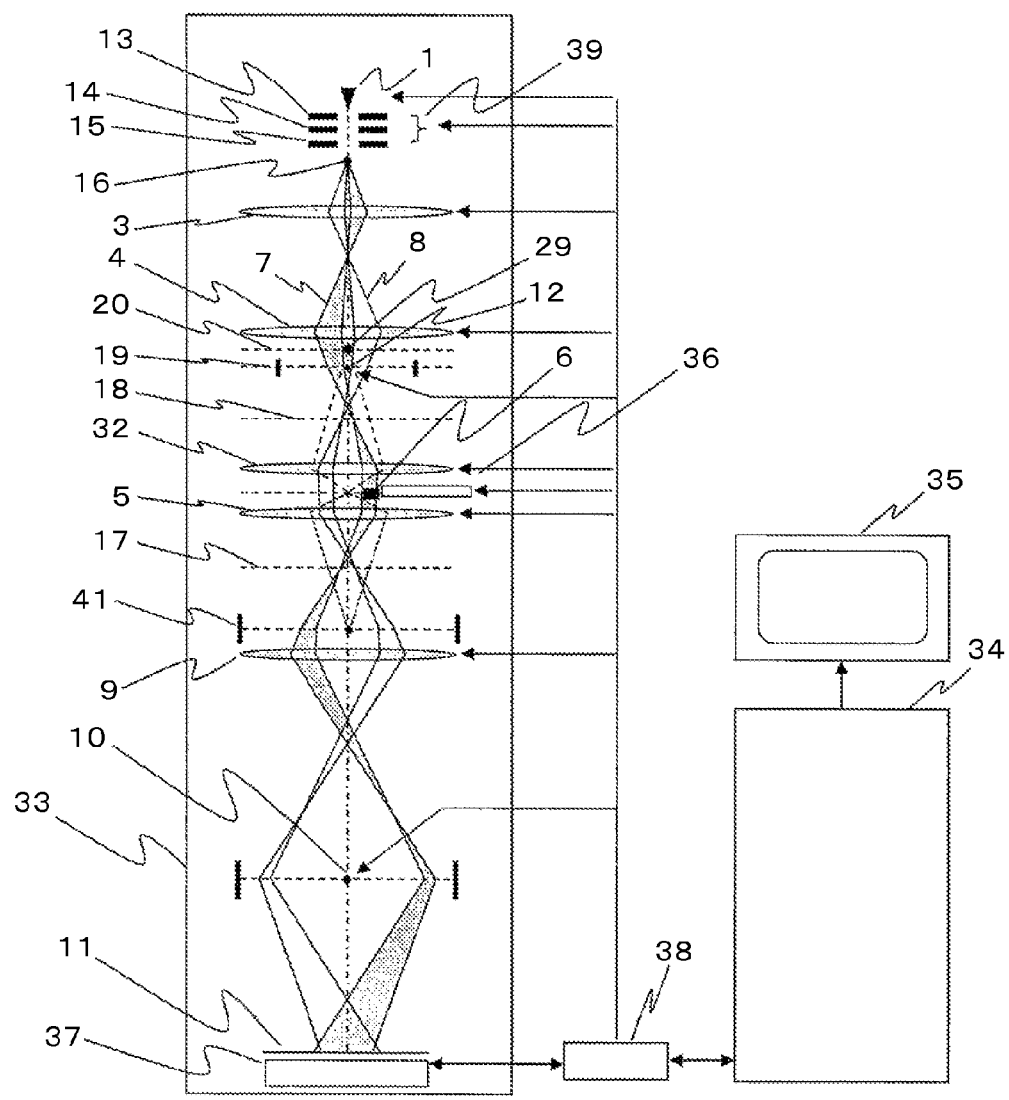
FIG. 12 is a schematic diagram illustrating an example of an interference electron microscope according to an eighth embodiment that the first illumination electron lens, the second illumination electron lens, the mask, the first electron biprism, the third illumination electron lens, the sample, an objective lens, a third electron biprism, a magnifying lens and a second electron biprism are arranged in order.

FIG. 12 is a schematic diagram illustrating an example of a combination of an interference electron microscope with a two-stage electron biprism. An interference electron microscope according to the eighth embodiment includes in order the first illumination electron lens, the second illumination electron lens, the mask, the first electron biprism, the third illumination electron lens, the sample, the objective lens, a third electron biprism, the magnifying lens and the second electron biprism.

The present embodiment which is schematically illustrated in FIG. 12 and is configured by combining the interference electron microscope according to the sixth embodiment of the present invention with the two-stage biprism of the imaging lens system is merely one example of the combination and the present application is not limited to the shape illustrated in the schematic diagram of FIG. 12. Since the two-stage electron biprism is described in Japanese Patent Application Laid-Open No. 2006-216345 or 2006-313069 as described above, description thereof is omitted here. Incidentally, since the device configuration of the eighth embodiment is similar to that of the sixth embodiment, description of the same parts as those in the sixth embodiment is omitted.

A filament electrode of a third electron biprism 41 is arranged on an image surface on which an image of the sample is to be imaged by the action of the objective lens 5 between the objective lens 5 and the magnifying lens 9, and the second electron biprism 10 is arranged at the position of a shadow formed by the third electron biprism 41 between the magnifying lens 9 and an image surface on which an image is to be imaged by the action of the magnifying lens 9.

Arbitrary control of a spacing of electron beam interference fringes and a width of the interference region is allowed by controlling voltages to be applied to the second electron biprism 10 and the third electron biprism 41.

Although the present embodiment is configured by combining the device configuration of the sixth embodiment with the two-stage electron biprism, the effect of the two-stage electron biprism is obtained by combining any of the device configurations of the first to seventh embodiments with the two-stage electron biprism while obtaining the effect of the present invention.

[Ninth Embodiment]

Figure 13:
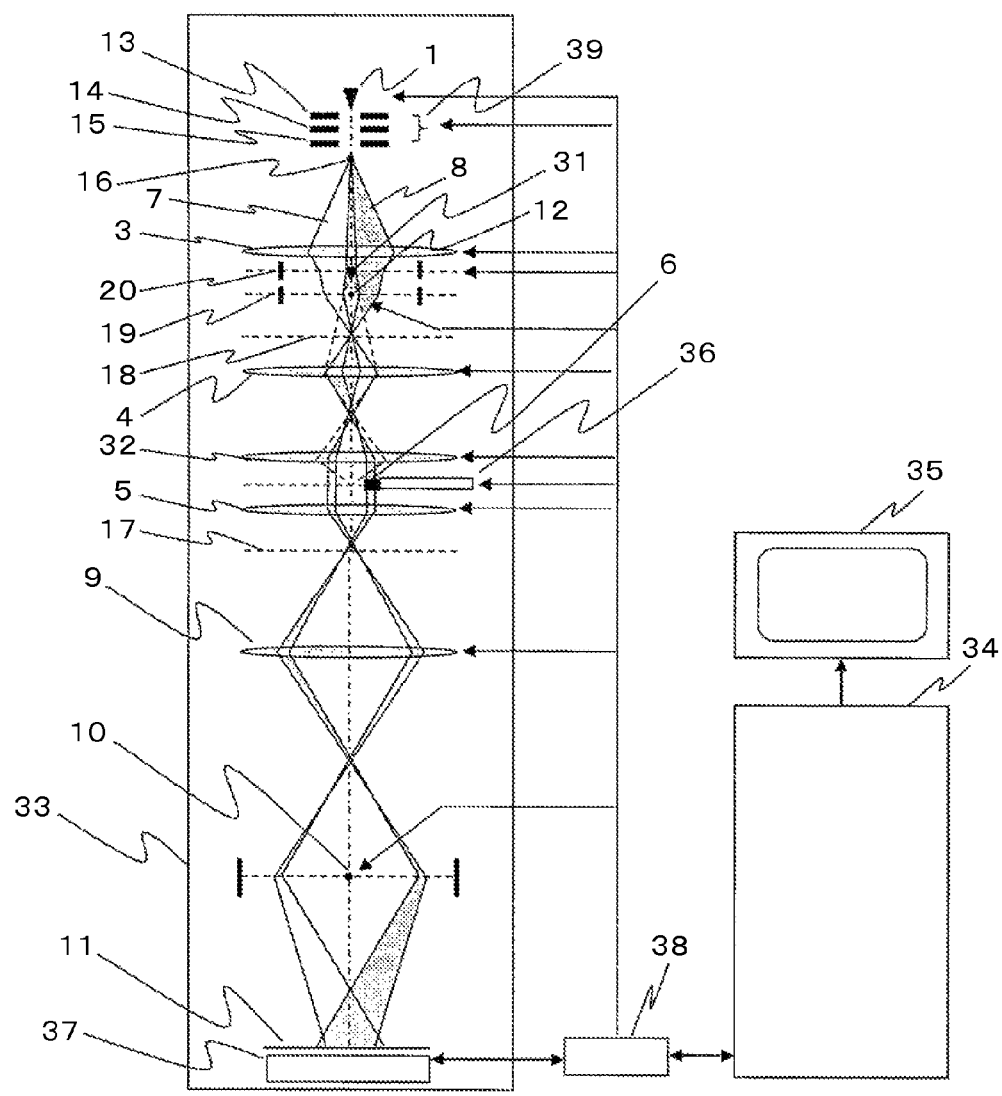
FIG. 13 is a schematic diagram illustrating an example of an interference electron microscope according to a ninth embodiment that the first illumination electron lens, a fourth electron biprism, the first electron biprism, the second illumination electron lens, the third illumination electron lens and the sample are arranged in order.

FIG. 13 is a schematic diagram illustrating an example of the ninth embodiment configured by replacing the mask 29 in the fifth embodiment with a fourth electron biprism 31. The interference electron microscope according to the ninth embodiment includes in order the first illumination electron lens, the fourth electron biprism, the first electron biprism, the second illumination electron lens, the third illumination electron lens and the sample. The present embodiment is merely one example in which the mask 29 is replaced with the fourth electron biprism 31 and the present application is not limited to the shape illustrated in the schematic diagram of FIG. 13. Since the device configuration of the present embodiment is similar to that of the fifth embodiment, description of the same parts as those in the fifth embodiment is omitted.

The first illumination electron biprism 12 is disposed in a shadow formed by the fourth electron biprism 31 which is disposed between the first illumination electron lens 3 and the second illumination electron lens 4, and the fourth electron biprism 31 is imaged on the sample surface by the action of the illumination-lens system. In the above-mentioned case, the Fresnel fringes are not generated from either the fourth electron biprism 31 or the first electron biprism 12 on the sample surface.

The first electron biprism has a function of controlling the positions of the electron beam 7 transmitted through the first region (the sample) and the electron beam 8 passing through the second region on the sample surface. On the other hand, the fourth electron biprism has a function of controlling illumination angles of the electron beam 7 transmitted through the first region (the sample) and the electron beam 8 passing through the second region on the sample surface.

As a specific effect of the present embodiment, arbitrary adjustment of the spacing of interference fringes of a hologram to be obtained is allowed without changing the width of the interference region.

In addition, the above-mentioned function of controlling the illumination angles of the electron beams on the sample surface is effective for observation of, for example, a crystalline sample and fine adjustment of the illumination angles of the electron beams relative to the crystal is allowed for the purpose of observing crystal orientation dependent electric field and magnetic field distributions. The above-mentioned function of adjusting the spacing of interference fringes will be obtained even if any of the masks described in the first to seventh embodiments is replaced with the fourth electron biprism 31.

[Tenth Embodiment]

Figure 14:
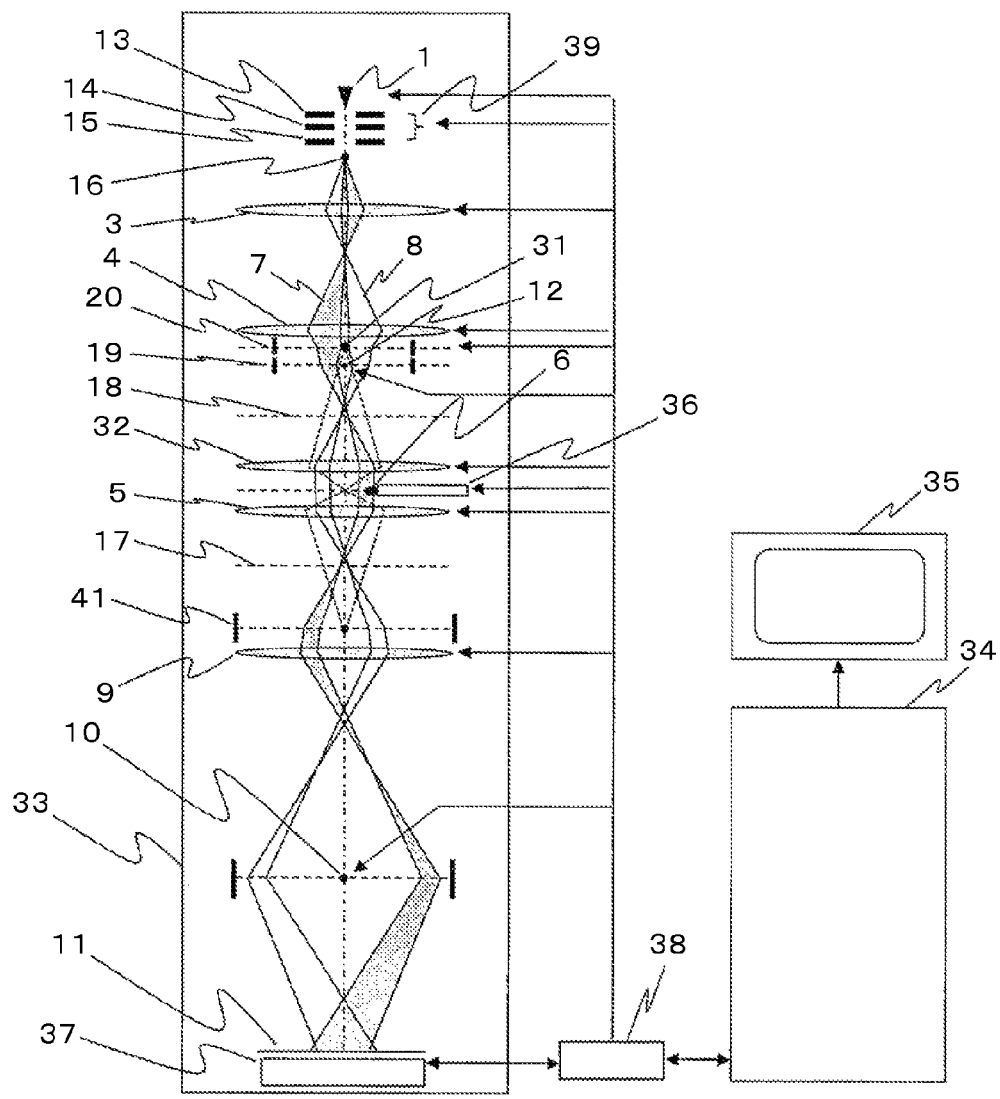
FIG. 14 is a schematic diagram illustrating an example of an interference electron microscope according to a tenth embodiment that the first illumination electron lens, the second illumination electron lens, the fourth electron biprism, the first electron biprism, the third illumination electron lens, the sample, the objective lens, the third electron biprism, the magnifying lens and the second electron biprism are arranged in order.

FIG. 14 is a schematic diagram illustrating an example of the tenth embodiment in which the interference electron microscope according to the present invention is combined with a two-stage electron biprism and the mask is replaced with the fourth electron biprism 31. The interference electron microscope according to the tenth embodiment includes in order the first illumination electron lens, the second illumination electron lens, the fourth illumination electron lens, the first electron biprism, the third illumination electron lens, the sample, the objective lens, the third electron biprism, the magnifying lens and the second electron biprism.

That is, the schematically illustrated present embodiment of the interference electron microscope in which the device configuration of the sixth embodiment is combined with the two-stage biprism of the imaging lens system and the mask is replaced with the fourth electron biprism is merely an example of the combination and the present invention is not limited to the shape illustrated in the schematic diagram of FIG. 14. Since the two-stage electron biprism is described in Japanese Patent Application Laid-Open Nos. 2006-216345 and 2006-313069, description thereof is omitted here.

FIG. 14 is a schematic diagram illustrating an example of the tenth embodiment in which the device configuration of the sixth embodiment is combined with the two-stage electron biprism and the mask described in the eighth embodiment is replaced with the fourth electron prism. The device configuration of the present embodiment is similar to those of the sixth and eighth embodiments, description of the same parts as those in the sixth and eighth embodiments is omitted.

The first electron biprism 12 is disposed in the shadow formed by the fourth electron biprism 31 which is disposed between the second illumination electron lens 4 and the third illumination electron lens 32 and the fourth electron biprism 31 is imaged on the sample surface by the action of the illumination-lens system. In the above-mentioned case, the Fresnel fringes are not generated from either the fourth electron biprism 31 or the first electron biprism 12 on the sample surface.

Owing to the configuration of the present embodiment, the first electron biprism 12 has the function of controlling the positions of the electron beam 7 transmitted through the first region (the sample) and the electron beam 8 passing through the second region on the sample surface. On the other hand, the fourth electron biprism 31 has the function of controlling the illumination angles of the electron beam 7 transmitted through the first region (the sample) and the electron beam 8 passing through the second region on the sample surface.

The above-mentioned function of controlling the illumination angles of the electron beams on the sample surface is effective for observation of, for example, the crystalline sample and fine adjustment of the illumination angles of the electron beams relative to the crystal is possible for the purpose of observing the crystal orientation dependent electric field and magnetic field distributions.

The filament electrode of the third electron biprism 41 is arranged on the image surface on which the image of the sample is to be imaged by the action of the objective lens 5 between the objective lens 5 and the magnifying lens 9, and the second electron biprism 10 is arranged at the position of the shadow formed by the third electron biprism 41 between the magnifying lens 9 and the image surface on which the image is to be imaged by the action of the magnifying lens 9.

It is allowed to arbitrarily control the spacing of electron beam interference fringes and the width of the interference region is allowed by controlling voltages to be applied to the second electron biprism 10 and the third electron biprism 41.

In the present embodiment, it is allowed to control a position where the electron beams are to be radiated to the sample and it is also allowed to separately control the angles of the electron beams to be radiated relative to the sample, the spacing of the electron beam interference fringes and the width of the interference region by combining the above mentioned functions with one another.

Incidentally, the present embodiment is merely an example and the effect described in the present embodiment is obtained by combining any of the device configurations of the first to seventh embodiments with the two-stage electron biprism and by replacing the mask with the fourth electron biprism.

The above-mentioned present invention is not limited to the above-mentioned embodiments and includes various modified embodiments. For example, the above-mentioned embodiments are described in details in order to simply explain the present invention and are not necessarily limited to those including all the above-mentioned configurations.

In addition, a part of the configuration of one embodiment may be replaced with the configuration of another embodiment and the configuration of another embodiment may be added to the configuration of one embodiment. Further, other configurations may be added to, deleted from and replaced with a part of the configuration of each embodiment.

Further, each configuration, each function and the like of the above-mentioned control system may be partially or wholly implemented by hardware, for example, by designing them using an integrated circuit. Although description has been made by illustrating cases where each configuration, each function and the like of the control system are implemented by executing programs by a CPU or the like, information on programs, files and the like for implementing each function may be stored in a memory and in a recording medium such as a hard disc.

The above-mentioned interference electron microscope of the present invention is practically applied to an electron interference device and an electron holography device. It becomes possible to analyze a nano-structure, to observe a magnetic field and an electric field that a nano-scale structure has, and to freely observe a distribution of electron spins in a material, and utilization of the interference electron microscope according to the present invention to basic study of materials such as semiconductors, magnets, spintronics materials and others and applied development thereof.

[DESCRIPTION OF REFERENCE NUMERALS OR SYMBOLS]

1: electron source
2: electron beam
3: first illumination electron lens
4: second illumination electron lens
5: objective lens
6: sample
7: electron beam passing through a first region
8: electron beam passing through a second region
9: magnifying lens
10: second electron biprism
11: observation surface
12: first electron biprism
13: first extraction electrode
14: second extraction electrode
15: acceleration electrode
16: first electron source
17: second electron source surface directly under the objective lens
18: electro-optical electron source surface
19: electro-optical first filament electrode surface
20: electro-optical sample surface
21: electro-optical electron source
22: electro-optical first electron biprism
26: length between the electro-optical electron source and the electro-optical first filament electrode surface
27: length between the electro-optical first filament electrode and the electro-optical sample surface
28: length between the electro-optical electron source and the electro-optical sample surface
29: mask
30: electro-optical mask
31: fourth electron biprism
32: third illumination electron lens
33: microscope body 34: control PC
35: monitor
36: sample micro moving mechanism
37: electron detector
38: control system
39: acceleration tube
40: size of the electro-optical electron source
41: third electron biprism
42: parabolic surface of the objective lens
43: mask
101: electron source
102: size of the electron source
103: length between the electron source and the sample surface
104: sample surface

What is claimed is:

1. An interference electron microscope, comprising:
an electron source;
an acceleration tube for accelerating an electron beam emitted from the electron source to a predetermined speed;
an illumination-lens system for radiating the electron beam to a sample and including at least one electron lens;
a sample holding unit for holding the sample;
an objective lens system for imaging an image of the sample and including at least one electron lens;
an imaging lens system for imaging the image of the sample imaged by the objective lens system in a magnified or contracted state and including at least one electron lens;
an observation surface used for observing the image of the sample imaged by the imaging lens system;
an observation/recording system for observing or recording the image of the sample imaged on the observation surface;
a first electron biprism disposed between the acceleration tube and the illumination-lens system; and
a mask disposed between the acceleration tube and the first electron biprism, wherein
the objective lens system or the imaging lens system includes at least one electron biprism,
the electron beam is split into a first electron beam and a second electron beam by the mask,
current densities of the first electron beam and the second electron beam on a parabolic surface of the objective lens system where the sample is positioned are controlled by an optical action of the illumination-lens system,
an electro-optical length between the first electron beam biprism and the parabolic surface of the objective lens system where the sample is positioned is controlled by the optical action of the illumination-lens system, and
the mask is imaged on the parabolic surface of the objective lens system and mutually different first region and second region on the parabolic surface of the objective lens system where the sample is positioned are irradiated by the optical action of the illumination-lens system,
positions of the first region and second region are controlled by a deflecting action on the electron beams by the first electron beam biprism or the optical action on the first electron beam and the second electron beam by the illumination-lens system,
the first electron beam and the second electron beam are superposed on the observation surface by the electron beam biprism included in the objective lens system or the imaging lens system, and a superpose region on the observation surface where the first electron beam and the second electron beam are superposed is observed or recorded by the observation/recording system.

2. The interference electron microscope according to claim 1, wherein the first electron biprism is disposed in a shadow space that the mask forms.

3. The interference electron microscope according to claim 1, wherein the electron biprism included in the objective lens system or the imaging lens system is disposed in a shadow space that the mask forms.

4. The interference electron microscope according to claim 1, wherein the first electron biprism and the electron biprism included in the objective lens system or the imaging lens system deflect the first electron beam and the second electron beam in the same electro-optical plane including an optical axis.

5. The interference electron microscope according to claim 1, wherein electron beam interference fringes to be observed or recorded by the observation/recording system are formed in the superpose region formed on the observation surface, by deflecting actions on the first electron beam and the second electron beam by the first electron biprism and the electron biprism included in the objective lens system or the imaging lens system.

6. The interference electron microscope according to claim 1, wherein as the electron biprism included in the objective lens system or the imaging lens system, a second electron biprism and a third electron biprism are included, and
a plurality of electron lenses included in the objective lens system or a plurality of electron lenses included in the imaging lens system, the second electron biprism and the third electron biprism configure a two-stage electron biprism interference optical system.

7. The interference electron microscope according to claim 1, wherein a relationship meeting the following expression (3) or (4) is established when $\lambda$ is a wavelength of the electron beam as an electron wave, $\beta_M$ is an angle of aperture of an electro-optical electron source relative to an electro-optical mask surface, $d_M$ is a width which is vertical to a length-wise direction of an electro-optical bridged mask and when $L_M$ is a coherence length of the electron wave on the electro-optical mask surface:

[Numerical Formula 6]

$$\beta_M < \lambda/2d_M \quad (3)$$

[Numerical Formula 7]

$$L_M > d_M \quad (4)$$

8. The interference electron microscope according to claim 1, wherein a relationship meeting the following expression (5) is established when L2 is a length between an electro-optical first electron biprism and an electro-optical sample surface:

[Numerical Formula 8]

$$0 \neq L2 \quad (5)$$

9. The interference electron microscope according to claim 1, wherein the mask is a fourth electron biprism, and
the fourth electron biprism operates to make the first electron biprism and the electron biprism included in the objective lens system or the imaging lens system deflect the first electron beam and the second electron beam in the same electro-optical plane including an optical axis relative to which the first electron beam and the second electron beam are deflected.

10. The interference electron microscope according to claim 1,
wherein the mask is a fourth electron biprism, and
the fourth electron biprism operates to control inclinations of electron beams to be radiated to the first region and the second region on the parabolic surface.

11. An interference electron microscope, comprising:
an electron source;
an acceleration tube for accelerating an electron beam emitted from the electron source to a predetermined speed;
an illumination-lens system for radiating the electron beam to a sample;
a sample holding unit for holding the sample;
an objective lens system for imaging an image of the sample and including at least one electron lens;
an imaging lens system for imaging the image of the sample imaged by the objective lens system in a magnified or contracted state;
an observation surface used for observing the image of the sample imaged by the imaging lens system;
an observation/recording system for observing or recording the image of the sample imaged on the observation surface;
a first electron biprism disposed between an electron lens positioned uppermost-stream of the illumination-lens system in an electron beam traveling direction and the sample; and
a mask disposed between the acceleration tube and the first electron biprism, wherein
the objective lens system or the imaging lens system includes at least one electron biprism,
the electron beam is split into a first electron beam and a second electron beam by the mask,
current densities of the first electron beam and the second electron beam on a parabolic surface of the objective lens system where the sample is positioned are controlled by an optical action of the illumination-lens system,
the mask is imaged on the parabolic surface of the objective lens system by the optical action of the illumination-lens system,
an electro-optical length between the first electron beam biprism and the parabolic surface of the objective lens system where the sample is positioned is controlled and mutually different first region and second region on the parabolic surface of the objective lens where the sample is positioned are irradiated by the optical action of the illumination-lens system,
positions of the first region and second region are controlled by a deflecting action on the electron beams by the first electron beam biprism or the optical action on the first electron beam and the second electron beam by the illumination-lens system, and
the first electron beam and the second electron beam are superposed on the observation surface by the electron beam biprism included in the imaging lens system and a superpose region on the observation surface where the first electron beam and the second electron beam are superposed is observed or recorded by the observation/recording system.

12. The interference electron microscope according to claim 11,
wherein the illumination-lens system includes two electron lenses, and
the mask, a first illumination electron lens, the first electron biprism and a second illumination electron lens are arranged in order from the upstream side of a traveling direction of the electron beams.

13. The interference electron microscope according to claim 11,
wherein the illumination-lens system includes two electron lenses, and
a first illumination electron lens, the mask, the first electron biprism and a second illumination electron lens are arranged in order from the upstream side of a traveling direction of the electron beams.

14. The interference electron microscope according to claim 11,
wherein the illumination-lens system includes two electron lenses, and
the mask, a first illumination electron lens, a second illumination electron lens and the first electron biprism are arranged in order from the upstream side of a traveling direction of the electron beams.

15. The interference electron microscope according to claim 11,
wherein the illumination-lens system includes two electron lenses, and
a first illumination electron lens, the mask, a second illumination electron lens and the first electron biprism are arranged in order from the upstream side of a traveling direction of the electron beams.

16. The interference electron microscope according to claim 11,
wherein the illumination-lens system includes three electron lenses, and
the mask, a first illumination electron lens, the first electron biprism, a second illumination electron lens and a third illumination electron lens are arranged in order from the upstream side of a traveling direction of the electron beams.

17. The interference electron microscope according to claim 11,
wherein the illumination-lens system includes three electron lenses, and
a first illumination electron lens, the mask, the first electron biprism, a second illumination electron lens and a third illumination electron lens are arranged in order from the upstream side of a traveling direction of the electron beams.

18. The interference electron microscope according to claim 11,
wherein the illumination-lens system includes three electron lenses, and
the mask, a first illumination electron lens, a second illumination electron lens, the first electron biprism and a third illumination electron lens are arranged in order from the upstream side of a traveling direction of the electron beams.

19. The interference electron microscope according to claim 11,
wherein the illumination-lens system includes three electron lenses, and
a first illumination electron lens, the mask, a second illumination electron lens, the first electron biprism and a third illumination electron lens are arranged in order starting the upstream side of a traveling direction of the electron beams.

20. The interference electron microscope according to claim 11,
wherein the illumination-lens system includes three electron lenses, and
a first illumination electron lens, a second illumination electron lens, the mask, the first electron biprism and a third illumination electron lens are arranged in order from the upstream side of a traveling direction of the electron beams.

21. The interference electron microscope according to claim 11,
wherein the illumination-lens system includes three electron lenses, and
the mask, a first illumination electron lens, a second illumination electron lens, a third illumination electron lens and the first electron biprism are arranged in order from the upstream side of a traveling direction of the electron beams.

22. The interference electron microscope according to claim 11,
wherein the illumination-lens system includes three electron lenses, and
a first illumination electron lens, the mask, a second illumination electron lens, a third illumination electron lens and the first electron biprism are arranged in order from the upstream side of a traveling direction of the electron beam.

23. The interference electron microscope according to claim 11,
wherein the illumination-lens system includes three electron lenses, and
a first illumination electron lens, a second illumination electron lens, the mask, a third illumination electron lens and the first electron biprism are arranged in order from the upstream side of a traveling direction of the electron beams.

24. The interference electron microscope according to claim 11, wherein the first electron biprism and/or an electron biprism included in the objective lens system or the imaging lens system are/is arranged in a shadow space that the mask forms.

25. The interference electron microscope according to claim 11, wherein the first electron biprism and an electron biprism included in the objective lens system or the imaging lens system deflect the first electron beam and the second electron beam in the same electro-optical plane including an optical axis.

26. The interference electron microscope according to claim 11, wherein electron beam interference fringes to be observed or recorded by the observation/recording system are formed in the superpose region formed on the observation surface by deflecting actions on the first electron beam and the second electron beam by the first electron biprism and an electron biprism included in the objective lens system or the imaging lens system.

27. The interference electron microscope according to claim 11,
wherein as an electron biprism included in the objective lens system or the imaging lens system, a second electron biprism and a third electron biprism are included, and
a plurality of electron lenses included in the objective lens system or a plurality of electron lenses included in the imaging lens system, the second electron biprism and the third electron biprism configure a two-stage electron biprism interference optical system.

28. The interference electron microscope according to claim 11,
wherein a relationship meeting the following expression (3) or (4) is established when $\lambda$ is a wavelength of the electron beam, $\beta_M$ is an angle of aperture of an electro-optical electron source relative to an electro-optical mask surface and $d_M$ is a width which is vertical to a length-wise direction of an electro-optical bridged mask, and when $L_M$ is a coherence length of an electron wave on the electro-optical mask surface:

[Numerical Formula 9]

$$\beta_M < \lambda/2d_M \tag{3}$$

[Numerical Formula 10]

$$L_M > d_M \tag{4}$$

29. The interference electron microscope according to claim 11,
wherein a relationship meeting the following expression (5) is established when L2 is a length between the electro-optical first electron biprism and an electro-optical sample surface:

[Numerical Formula 11]

$$0 \neq L2 \tag{5}$$

30. The interference electron microscope according to claim 11,
wherein the mask is a fourth electron biprism, and
the fourth electron beam operates to make the first electron biprism and an electron biprism included in the objective lens system or the imaging lens system deflect the first electron beam and the second electron beam in the same electro-optical plane including an optical axis relative to which the first electron beam and the second electron beam are deflected.

31. The interference electron microscope according to claim 11,
wherein the mask is a fourth electron biprism, and
the fourth electron biprism operates to control inclinations of electron beams to be radiated to the first region and the second region on the parabolic surface.

* * * * *